(12) United States Patent
Mukai

(10) Patent No.: US 6,856,716 B2
(45) Date of Patent: Feb. 15, 2005

(54) OPTICAL INTERFEROMETER GENERATING A MODE-LOCKED LASER OSCILLATION, ALL-OPTICAL SWITCH, ALL-OPTICAL ASYMMETRIC DEMULTIPLEXER AND ALL OPTICAL PULSE RESHAPING APPARATUS

(75) Inventor: Kohki Mukai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 10/319,515

(22) Filed: Dec. 16, 2002

(65) Prior Publication Data

US 2003/0123784 A1 Jul. 3, 2003

(30) Foreign Application Priority Data

Dec. 17, 2001 (JP) ........................................ 2001-383725

(51) Int. Cl.[7] .................................................. G02B 6/42
(52) U.S. Cl. ........................... 385/15; 385/39; 356/477; 356/480
(58) Field of Search ................................ 385/15, 39, 1, 385/3; 356/450, 454, 477, 480

(56) References Cited

U.S. PATENT DOCUMENTS

| | | | | | |
|---|---|---|---|---|---|
| 5,377,284 | A | * | 12/1994 | Bulow | 385/11 |
| 5,825,519 | A | * | 10/1998 | Prucnal | 398/98 |
| 6,034,770 | A | * | 3/2000 | Kim et al. | 356/459 |
| 6,226,090 | B1 | * | 5/2001 | Yoneyama | 356/450 |
| 6,697,548 | B2 | * | 2/2004 | LoCascio et al. | 385/16 |

* cited by examiner

Primary Examiner—Diane I. Lee
Assistant Examiner—Daniel A. Hess
(74) Attorney, Agent, or Firm—Armstrong, Kratz, Quintos, Hanson & Brooks, LLP

(57) ABSTRACT

An all-optical switch, an all-optical signal waveform reshaping element and an all-optical asymmetric demultiplexer are formed of an optical interferometer having a compact and simple structure. Nonlinear gain media are provided at positions different from each other in two arms of a Mach-Zehnder optical interferometer. Then, an optical cavity is formed by mounting a mirror on an optical input-output port in each of a first and a second multi-mode optical interferometers connected with the two arms. Furthermore, when a saturable absorption medium is placed on the mirror of one of the multi-mode optical interferometers, a mode-locked laser oscillation is induced.

18 Claims, 24 Drawing Sheets

RESHAPING

RETIMING

REGENERATION

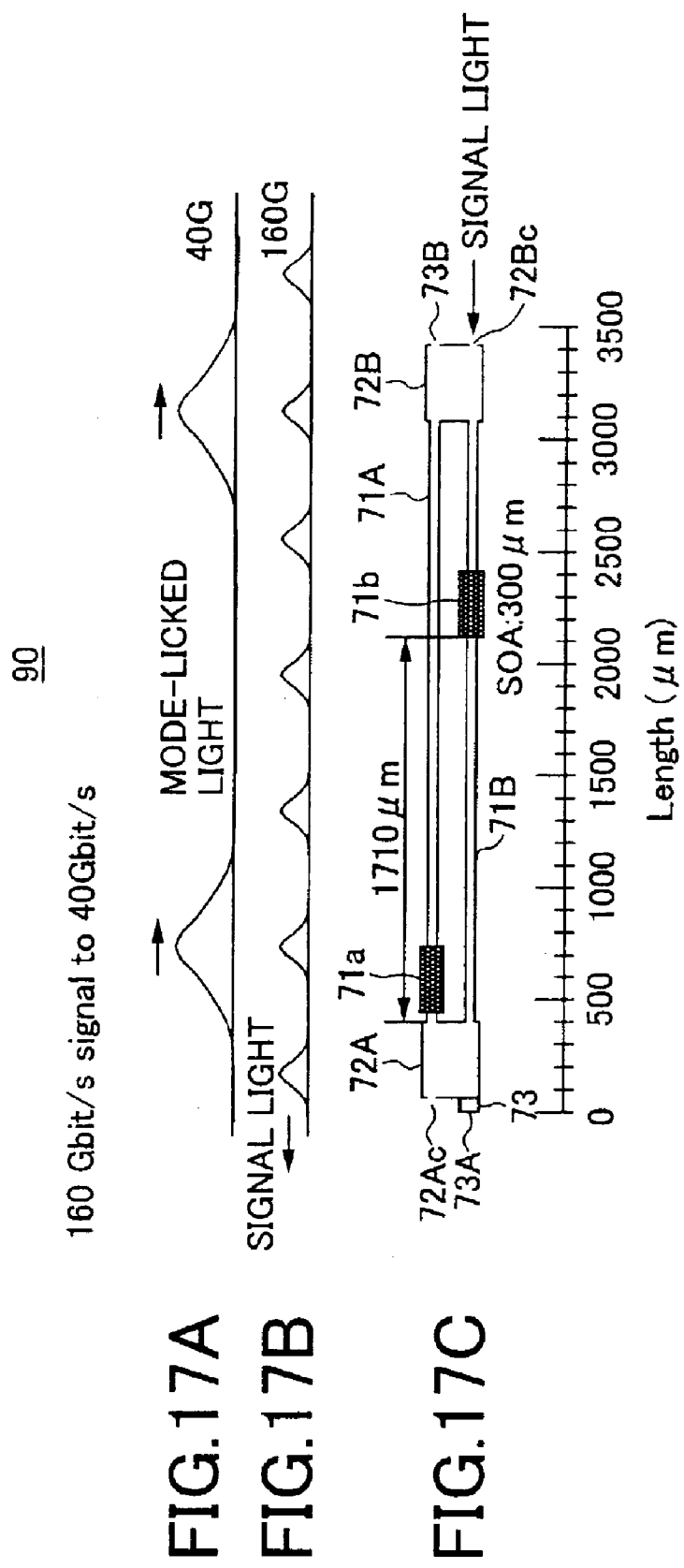

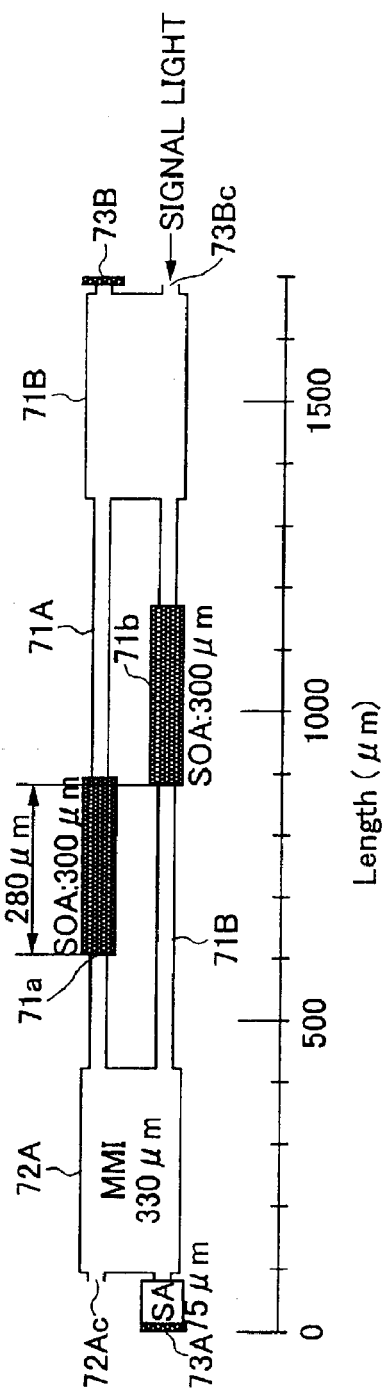
FIG.19A
FIG.19B
FIG.19C

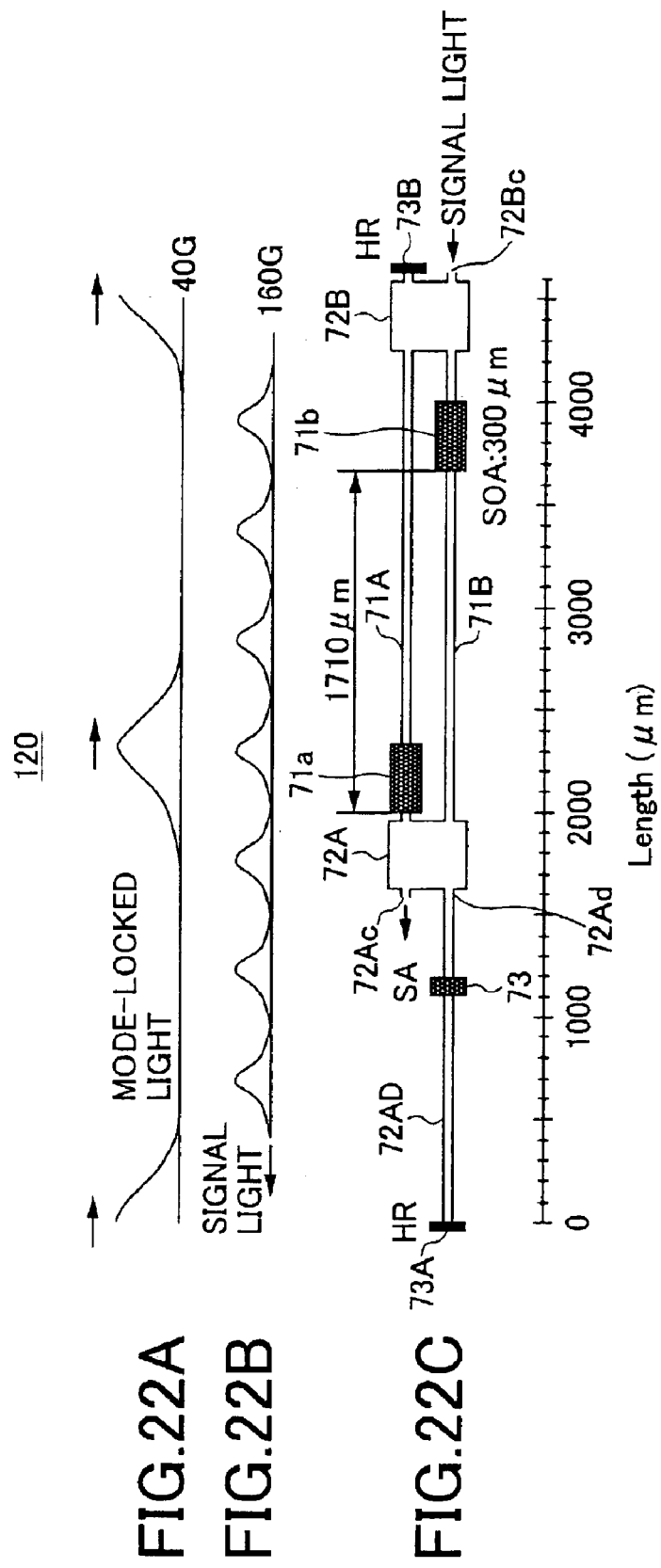

OPTICAL INTERFEROMETER GENERATING A MODE-LOCKED LASER OSCILLATION, ALL-OPTICAL SWITCH, ALL-OPTICAL ASYMMETRIC DEMULTIPLEXER AND ALL OPTICAL PULSE RESHAPING APPARATUS

GROSS REFERENCE TO RELATED APPLICATIONS

The present application is based on Japanese priority application No. 2001-383725 filed Dec. 17, 2001, the entire contents of which are hereby incorporated by reference.

BACKGROUND OF THE INVENTION

1. Field of the Invention

The present invention generally relates to optical communication arts, and more particularly to an optical element that serves for a high-capacity optical communication and achieves stable performance with a simple structure.

2. Description of the Related Art

In recent high-capacity optical communication arts, WDM (Wavelength Division Multiplexing) is typically used to deal with large traffic volume. In the WDM, optical signal components each of which has a different wavelength from each other are formed in correspondence with a large number of signals, and these optical signal components are multiplexed to form a single wavelength multiplexed optical signal.

On the other hand, in order to further increase a communication capacity in the WDM, OTDM (Optical Time Division Multiplexing) or TWDM (Time Wavelength Division Multiplexing) are presented as an optical communication technique for performing a time division multiplexing for individual wavelength components.

While the WDM is designed to improve the signal density by wavelength-multiplexing a signal light, the optical time division multiplexing technique such as the OTDM and the TWDM aims at further improving the signal density of a pulse light that has an extremely narrow spectrum width with respect to wavelengths of individual components and ultimately achieving the transmission rate higher than 160 Gbit/s.

In implementation of an optical signal transmission under the OTDM by using a conventional technique, it is necessary to temporarily convert an optical signal entering at the transmission rate higher than 160 Gbit/s into an electric signal through a photoelectric conversion so as to perform timing extraction, waveform reshaping and signal regeneration and then convert the resulting electric signal into an optical signal through an electricphoto conversion. In this case, since the response speed of the electric signal is restricted by the traveling time of a carrier in a photo diode used for the photoelectric conversion, it is impossible to achieve the response speed required to detect the optical signal even if a high-speed PIN photo diode is used.

At present, the limit of the detection speed of an electric signal is about 40 Gbit/s. In order to process an OTDM signal having the speed higher than 40 Gbit/s, it is necessary to divide an optical signal by performing a high-speed optical signal process and then perform an optical asymmetric demultiplexing process for the divided optical signals so as to fall the bit rate at the feasible speed for electric processes.

In response to the above-mentioned circumstance, there have been some researches on devices to process an optical signal without converting into an electric signal. An optical asymmetric demultiplexing switch for controlling an optical signal and an all-optical signal waveform reshaping element for directly reshaping an optical signal waveform without conversion are typical as the devices to process an optical signal without converting into an electric signal.

A description will now be given, with reference to accompanying drawings, of the above-mentioned conventional techniques and devices.

FIG. 1 shows a structure of an optical asymmetric demultiplexing signal processing system 10 that is constructed according to a currently available technique.

The timing extraction is a primary technique for the optical asymmetric demultiplexing process. The timing extraction serves to synchronize a process with a signal light. In FIG. 1, the timing extraction is performed by partially using an electric element.

In FIG. 1, a beam splitter 11 splits an input signal light into a first branch 11A and a second branch 11B. The signal light in the first branch 11A is directly delivered to an optical switch 12. In contrast, the signal light in the second branch 11B is photoelectric-converted by a photo diode 13. The converted electric signal passes through a PLL (Phase Locked Loop) circuit 14 so that the PLL circuit 14 can be synchronized with a synchronous signal of the converted electric signal. Then, an output of a timing generator 15A synchronizing with the PLL circuit 14 oscillates a pulse laser 15 for generating a control light. The generated control light is supplied to the optical switch 12, and the optical switch 12 switches the signal light in the first branch 11A. As a result, it is possible to achieve a desired DEMUX.

However, the above method is not preferred with respect to the fabrication cost in that the optical asymmetric demultiplexing signal processing system 10 has the complicated and large structure because the optical asymmetric demultiplexing signal processing system 10 includes the conversion process to temporarily convert the input optical signal into the electric signal. Additionally, it is difficult to implement a light receiving element for detecting the high-speed optical signal traveling at 160 Gbit/s under such a structure.

FIG. 2 shows a structure of a conventional optical asymmetric demultiplexing signal processing system 10A in which a mode-locked laser is used to eliminate the above-mentioned problem, wherein those parts corresponding to the parts in FIG. 1 are referred to as the same reference numerals and the description thereof will be omitted.

In FIG. 2, while the beam splitter 11 splits a signal light into the first branch 11A and the second branch 11B like the method described with respect to FIG. 1, a mode-locked laser 16 is provided to directly receive the signal light in the branch 11B with no conversion. Since a mode lock is generated in the mode-locked laser 16 by involving in timing of the signal light, it is possible to obtain a pulse oscillation of the required timing. Consequently, when an output light of the mode-locked laser 16, which serves for the mode-locked oscillation, is delivered to the optical switch 12, it is possible to achieve a desired DEMUX.

In the structure in FIG. 2, it is possible to deal with all processes without any conversion of the optical signal into an electric signal because there is no photoelectric conversion and no process on which an electric circuit is used. As a result, it is possible to simplify the structure of the optical asymmetric demultiplexing signal processing system 10A.

However, it is also necessary for the beam splitter 11 to split the signal light according to the structure in FIG. 2. Furthermore, it is necessary to combine the optical switch 12 and the mode-locked laser 16. Obviously, it is difficult to integrate the two parts in practice.

A description will now be given, with reference to FIGS. 3A through 3C, FIG. 4 and FIG. 5, of a conventional technique regarding the optical switch 12 and the mode-locked laser 16 and some objects of the conventional technique in conjunction with the above-mentioned problem.

Conventionally, various all-optical interference devices are presented for the optical switch 12: a NOLM (Nonlinear Optical Loop Mirror) optical switch 20 in FIG. 3A, a Mach-Zehnder optical switch 30 in FIG. 3B and a polarization-discriminating optical switch 40 in FIG. 3C.

In FIG. 3A, an optical fiber loop 21 is formed of an optical fiber 21A in the NOLM optical switch 20. An injected signal light is divided into optical signal components, and the optical signal components are transmitted in the optical fiber loop 21 in such a way that one of the optical signal components can travel in the opposite direction to the other optical signal component. In the optical fiber loop 21, a waveguide 21B (hereinafter referred to as a nonlinear waveguide) is provided at an asymmetric position to the position in which the signal light is injected. The nonlinear waveguide 21B changes a refractive index in accordance with a control light from an exterior. Then, when the traveling direction of the signal light components are reversed in the optical fiber loop 21, there arises a differential phase shift by the timing gap when the signal light components pass through the nonlinear waveguide 21B. As a result, when the two signal light components are multiplexed, the phase difference switches the signal light.

As mentioned above, the NOLM optical switch 20 can form the all-optical switch 12 in a comparatively simple structure. However, in order to operate the NOLM optical switch 20, it is necessary to pass a first pulse through a gain medium constituting the nonlinear waveguide 21B and then inject the control light and further pass a second pulse through the gain medium. In the above manner, a bit rate for the switch process is restricted in accordance with the time when the optical signal passes in the optical fiber loop 21. Additionally, as long as a conventional optical fiber loop is used in the NOLM optical switch, there is a limit of miniaturization of the apparatus.

In FIG. 3B, the Mach-Zehnder all-optical switch 30 has a structure wherein nonlinear waveguides 32A and 32B are provided in arms 31A and 31B constituting a Mach-Zehnder optical interferometer, respectively. A signal light injected from a waveguide 33A is divided into the arms 31A and 31B and is delivered to the nonlinear waveguides 32A and 32B. On the other hand, a signal light injected from a waveguide 33B is delivered to the nonlinear waveguides 32A and 32B at the different timing from each other. As a result, a differential phase shift arises between the signal lights passing through the arms 31A and 31B. Thus, when the signal lights are multiplexed, the differential phase shift causes the switching.

In the Mach-Zehnder all-optical switch 30, however, while the operation speed is not restricted due to the light passing time unlike the NOLM optical switch 20, it is necessary to place two arms in which nonlinear waveguides are incorporated in parallel and further provide parts serving to multiplex control lights in each of the arms. Thus, the Mach-Zehnder all-optical switch 30 cannot help having a large structure.

In FIG. 3C, the polarization-discriminating optical switch 40 delays one polarized component of an optical signal injected from a waveguide 41A by a birefringent crystal (polarization-discriminating delay circuit) 42 and simultaneously performs a phase shift for two polarized components of the optical signal in a nonlinear waveguide 43 on the identical optical axis. Furthermore, the resulting polarized components are restored in a polarization-discriminating delay circuit 44, and a polarizer 45 retrieves only a pulse whose phase is different based upon the polarized components. A control light from a waveguide 41B controls the nonlinear waveguide 43. In this system, it is possible to simplify the system structure because the system has only one arm of the optical interferometer unlike the Mach-Zehnder all-optical switch. However, since the optical signal in the optical fiber has a random polarized component, it is difficult to apply the polarization-discriminating optical switch 40 to an optical fiber communication system.

A description will now be given, with reference to FIG. 4, of a mode-locked laser used in the DEMUX processing system 10A in FIG. 2.

FIG. 4 shows a structure of a conventional mode-locked laser 50 formed of a laser diode.

In FIG. 4, gain areas 50A and 50B are provided in an optical cavity extending in the axis direction in the mode-locked laser 50. A saturable absorption area 50C is provided between the gain areas 50A and 50B. Electrodes 51A, 51B and 51C are provided for the gain areas 50A and 50B and the saturable absorption area 50C. A forward-biased actuating current is injected to the electrodes 51A and 51B, whereas a reverse-biased voltage is applied to the electrode 51C.

In FIG. 4, the mode-locked laser 50 has a structure in which the saturable absorption area 50C is placed at the center of the optical cavity with respect to the axis direction. According to this structure, a pulse light, which is called a colliding mode-locked pulse, is layered in the saturable absorption area 50C, thereby enhancing the effect of optical saturation. This saturable absorber periodically modulates the traveling light in the optical cavity, thereby generating an oscillation at a certain frequency in accordance with the length of the cavity. As mentioned above, this system performs the mode-locked operation.

FIG. 5 shows another structure of the mode-locked laser wherein those parts in FIG. 5 corresponding to the parts in FIG. 4 are designated by the same reference numerals and the description thereof will be omitted.

In FIG. 5, the laser diode in FIG. 4 is folded back at the center. A high reflective mirror 52 is provided on one end surface of the laser diode so as to shorten the cavity length in half. The laser diode in FIG. 5 is virtually equivalent to that in FIG. 4.

Apart from the above-mentioned mode-locked laser, a mode-locked laser in which an optical fiber is used is additionally presented.

As mentioned above, various types of optical switches and mode-locked lasers have been presented. However, the integration of these parts requires a sophisticated technique even if the parts are semiconductor elements. Thus, it is found extremely difficult to miniaturize the entire optical DEMUX system by using existing techniques.

A description will now be given, with reference to FIGS. 6A through 6C and FIG. 7, of conventional methods with respect to another technique according to the present invention, that is, a reshaping technique of an optical signal waveform without any conversion. This reshaping technique is quite difficult and any promising method is not presented even in conferences at present.

An optical signal deteriorates while the optical signal is traveling in an optical fiber. Three processes to recover the deteriorated optical signal are generally called "3R", which originates from initial letters of the three processes. The 3R represents a reshaping process shown in FIG. 6A, a retiming process shown in FIG. 6B, and a regeneration process shown in FIG. 6C. The reshaping process modifies the intensity of a disordered optical signal so that "0/1" of the optical signal can be identified. The retiming process modifies the timing of an optical signal. The regeneration process recovers a weakened optical signal.

An optical signal waveform reshaping element 60 in which a wavelength converter is used to perform the 3R processes is presented in FIG. 7.

In FIG. 7, a wavelength converter 62 receives an input optical signal $\lambda s$ via an optical waveguide 61A together with a light having another wavelength $\lambda p$ from a continuous wave (CW) illuminant 61B. The wavelength converter 62, which is a light element generating saturable absorption, usually absorbs all lights from the CW illuminant 61B. However, if a signal light is injected from the waveguide 61A, absorption saturation is generated due to the signal light. As a result, the light from the CW illuminant 61B whose wavelength is $\lambda p$ is output without absorption. In this manner, the injected optical signal is supplied as an optical output of the wavelength converter 62.

When the wavelength converter 62 performs the absorption saturation process, it is possible to eliminate the disorder of the signal light intensity to some extent by the output of the CW illuminant 61B and the saturation characteristic of the wavelength converter 62. In this manner, the reshaping process in FIG. 6A is achieved. The output optical signal from the wavelength converter 62 is amplified when the output optical signal passes through an optical fiber amplifier 63. As a result, the retiming process in FIG. 6B is achieved.

A PLL circuit 64 receives an electrical signal corresponding to the fluctuation of a carrier density caused by the injected optical signal in the wavelength converter 62 and is synchronized with timing of the optical signal. The PLL circuit 64 actuates an electric field absorption (EA) modulator 65, and a continuous light from another continuous wave illuminant 66 is supplied to the EA modulator 65. Consequently, the EA modulator 65 modulates the continuous wave light from the continuous wave illuminant 66 synchronously with the timing of the injected optical signal.

It is possible to set the wavelength $\lambda s$ of the continuous light from the continuous wave illuminant 66, for example, to the same wavelength as the input signal light. As a result, the pulse light formed by the EA modulator 65 has an ideal waveform and timing for the input signal light.

A wavelength converter 67, which performs the saturable absorption, receives the optical signal amplified by the fiber amplifier 63 from the illuminant 61B and the optical signal modulated by the EA modulator from the illuminant 66. While the wavelength converter 67 is set to absorb the optical signal from the fiber amplifier 63 if there is no optical signal from the EA modulator 65, the wavelength converter 67 passes the light from the fiber amplifier 63 under the saturable absorption function if an optical signal is injected from the EA modulator 65.

As a result, the reshaping and retiming processes are performed for the optical signal produced by the fiber amplifier 63 according to the optical clock signal from the EA modulator 65, thereby achieving the reshaping in FIG. 6A and the retiming in FIG. 6B.

As mentioned above, it is possible to perform the 3R process for the signal light having the wavelength $\lambda s$ under the configuration shown in FIG. 7. However, the configuration is quite complicated as seen in the above description, and additionally the delicate control of the light intensity is required. Thus, the system is not sufficient for the practical use.

SUMMARY OF THE INVENTION

It is a general object of the present invention to provide a novel and useful optical demultiplexer in which the above-mentioned problems are eliminated.

A more specific object of the present invention is to provide an optical demultiplexer that achieves miniaturization, reliability and an easy-fabricated configuration.

Another object of the present invention is to provide an optical demultiplexer that has no structural restriction on the operational speed due to the light passing time and performs a polarization independent operation.

Further another object of the present invention is to provide an optical interferometer that is used for the optical demultiplexer.

In order to achieve the above-mentioned objects, there is provided according to one aspect of the present invention an optical interferometer, comprising: a first and a second optical waveguides separately extending from a first side to a second side facing the first side, the first and the second optical waveguides optically connected each other on the first side and the second side; and an optical cavity including the first and the second optical waveguides and extending between a first end part formed on the first side and a second end part formed on the second side, wherein the optical cavity has an optical output port provided on the first side by optically connecting the optical output port to the first and the second optical waveguides and an optical input port provided on the second side by optically connecting the optical input port to the first and the second optical waveguides, a first and a second nonlinear gain media optically inducing variation of a refractive index are provided in interiors of the first and the second optical waveguides, respectively, the optical cavity includes a saturable absorption medium provided on the first side by connecting the saturable absorption medium to the first and the second optical waveguides, and a mode-locked laser oscillation arises in the optical cavity.

Additionally, there is provided according to another aspect of the present invention an all-optical switch for switching a transmission of an external pulse light supplied to an optical input port to an optical output port, comprising: an optical interferometer comprising: a first and a second optical waveguides separately extending from a first side to a second side facing the first side, the first and the second optical waveguides optically connected each other on the first and the second sides; and an optical cavity including the first optical waveguide and the second optical waveguide and extending between a first end part formed on the first side and a second end part formed on the second side, wherein the optical cavity contains the optical output port provided on the first side by optically connecting the optical output port to the first and the second optical waveguides and the optical input port provided on the second side by optically connecting the optical input port to the first and the second optical waveguides, a first and a second nonlinear gain media optically causing variation of a refractive index are provided in the first and the second optical waveguides, respectively, and the optical cavity includes a saturable absorption medium provided on the first side by connecting the saturable absorption medium to the first and the second optical waveguides, wherein a mode-locked laser oscillation arises in the optical cavity, and the mode-locked laser oscillation has a pulse frequency lower than a pulse frequency of the external pulse light.

Additionally, there is provided according to another aspect of the present invention an all-optical asymmetric demultiplexer, comprising: a first optical interferometer having a first optical input port and a first and a second optical output ports, the first optical interferometer receiving an optical signal of a bit rate at the first optical input port and outputting a first asymmetric demultiplexed optical signal from the first optical output port; and a second optical interferometer having a second and a third optical input ports and a third and a fourth optical output ports, the second optical interferometer receiving the optical signal of the bit rate at the second optical input port and outputting a second asymmetric demultiplexed optical signal from the third optical output port, wherein the first optical interferometer comprises: a first and a second optical waveguides connected each other in a first and a second end parts; a high reflective surface provided in the first end part by optically connecting the high reflective surface to the first and the second optical waveguides, the high reflective surface reflecting an optical signal traveling in an interior of the first and the second waveguides; a saturable absorption medium provided in the first end part by optically connecting the saturable absorption medium to the first and the second optical waveguides; a first nonlinear gain medium provided in an interior of the first optical waveguide; and a second nonlinear gain medium provided in an interior of the second optical waveguide, the first optical output port is provided in the first end part by optically connecting the first optical output port to the first and the second optical waveguides, the second optical output port is provided in the second end part by optically connecting the second optical output port to the first and the second optical waveguides, the first optical input port is provided in the second end part by optically connecting the first optical input port to the first and the second optical waveguides, and wherein the second optical interferometer comprises: a third and a fourth optical waveguides connected each other in a third and a fourth end parts; a third nonlinear gain medium provided in an interior of the third optical waveguide; and a fourth nonlinear gain medium provided in an interior of the fourth optical waveguide, the second optical input port provided in the fourth end part by optically connecting the second optical input port to the third and the fourth optical waveguides, the third optical input port provided in the third end part by optically connecting the third optical input port to the third and the fourth optical waveguides, the third optical output port provided in the third end part by optically connecting the third optical output port to the third and the fourth optical waveguides, the fourth optical output port provided in the fourth end part by optically connecting the fourth optical output port to the third and the fourth optical waveguides, and the second optical output port is optically connected to the third optical input port, and wherein a mode-locked laser oscillation arises in the first and the second optical interferometers.

According to the above-mentioned inventions, a Mach-Zehnder optical interferometer is constructed by incorporating at least two optical multi-mode interferometers each of which has two inputs and two outputs. A nonlinear gain medium optically inducing variation of a refractive index is provided in each optical waveguide constituting two arms of the Mach-Zehnder optical interferometer. Additionally, a saturable absorption medium is connected to at least one of output ports from which an output of the optical multi-mode interferometers is supplied. Then, the saturable absorption medium and the nonlinear gain medium causes a passive mode-locked laser oscillation in an interior of the optical interferometer. As a result, it is possible to implement the optical interferometer that can be used as an all-optical switch, an all-optical asymmetric demultiplexer and an optical signal waveform reshaping apparatus.

Furthermore, according to the above-mentioned inventions, the optical interferometer according to the present invention can perform a polarization independent operation at the high speed. Also, the optical interferometer is compact and robust and builds in a mode-locked laser. As a result, the optical interferometer does not have to additionally multiplex an external mode-locked laser. Also, if parts of the optical interferometer are integrated on a common substrate, it is possible to overcome some problems such as complicated and delicate arrangements required for a combination of a plurality of devices.

Other objects, features and advantages of the present invention will become more apparent from the following detailed description when read in conjunction with the accompanying drawings.

BRIEF DESCRIPTION OF THE DRAWINGS

FIGS. 17A, 17B and 17C are diagrams illustrating a structure and an operation of an optical interferometer according to a third embodiment of the present invention;

FIGS. 19A, 19B and 19C are diagrams illustrating a structure and an operation of an optical interferometer according to a fifth embodiment of the present invention;

FIG. 22 is a diagram illustrating a structure of an optical interferometer according to a sixth embodiment of the present invention;

DETAILED DESCRIPTION OF THE PREFERRED EMBODIMENTS

In the following, embodiments of the present invention will be described with reference to the accompanying drawings.

Figure 1:
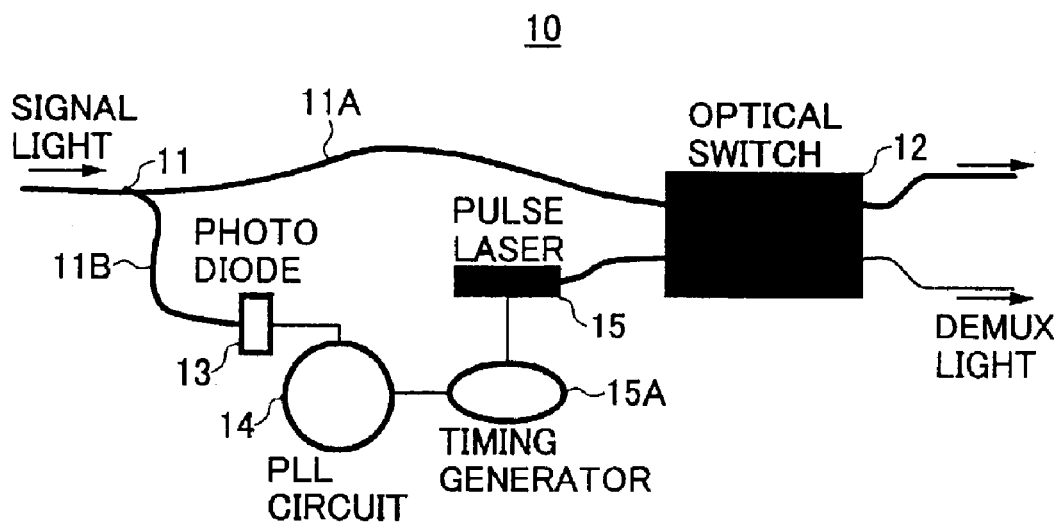
FIG. 1 is a diagram illustrating a structure of a conventional optical asymmetric demultiplexer.
Figure 2:
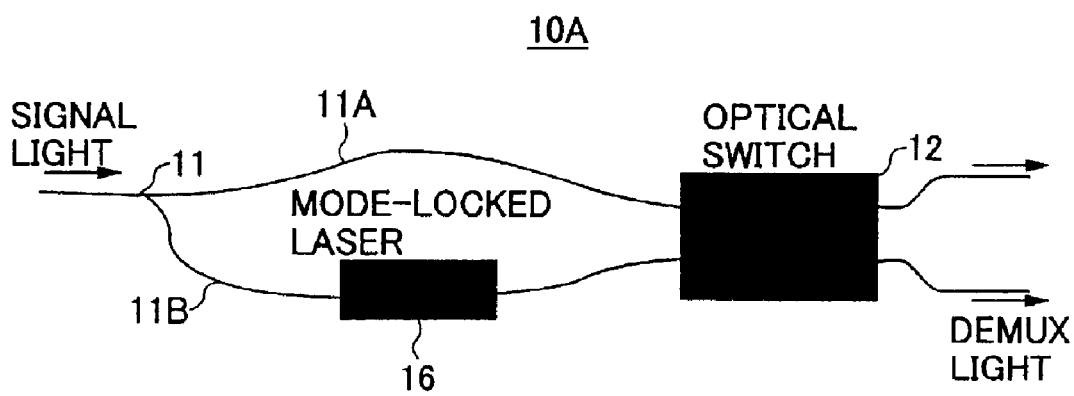
FIG. 2 is a diagram illustrating a structure of another type of conventional optical asymmetric demultiplexer.
Figure 3A:
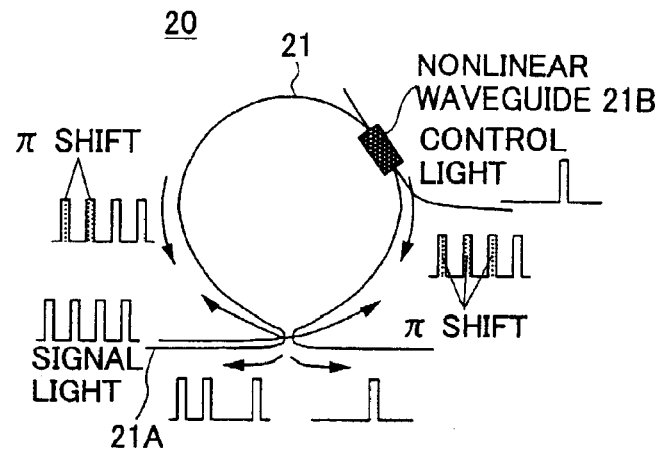
FIGS. 3A, 3B and 3C are diagrams illustrating other types of conventional optical asymmetric demultiplexer.
Figure 3B:
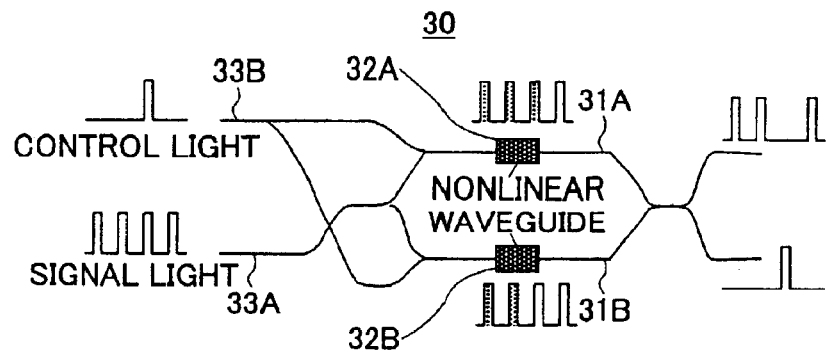
Figure 3C:
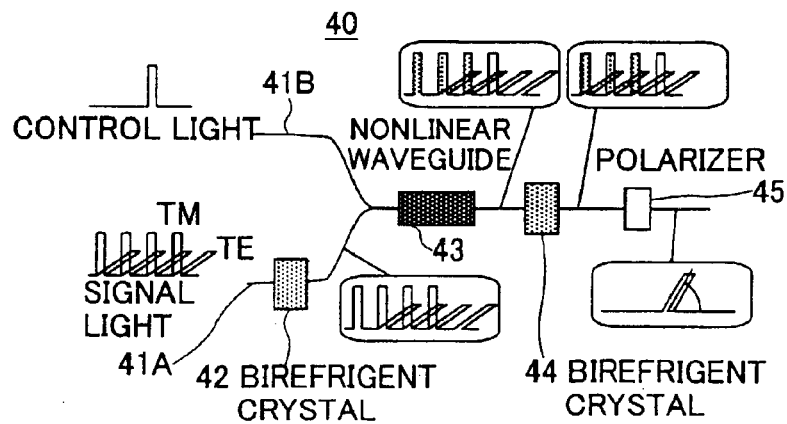
Figure 4:
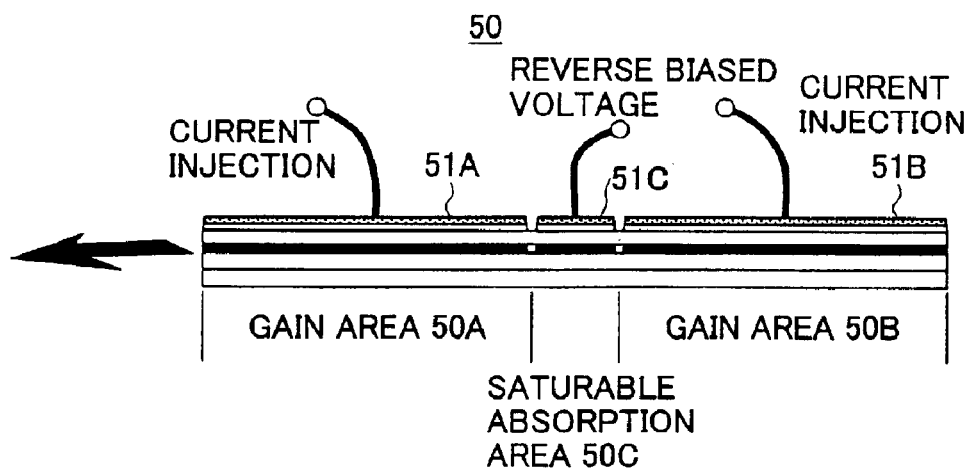
FIG. 4 is a diagram illustraing a structure of a conventional mode-locked laser.
Figure 5:
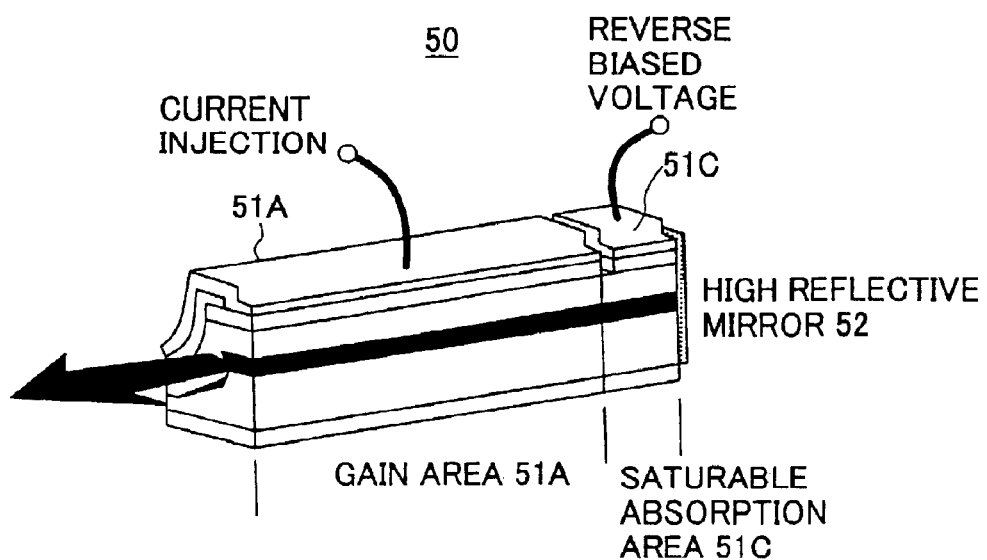
FIG. 5 is a diagram illustraing a structure of another type of the conventional optical asymmetric demultiplexer.
Figure 6A:
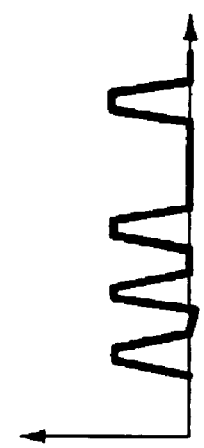
FIGS. 6A, 6B and 6C are diagrams illustrating examples of re-shaping, re-timing and re-generation of an optical signal.
Figure 6B:
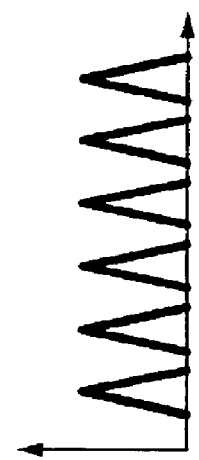
Figure 6C:
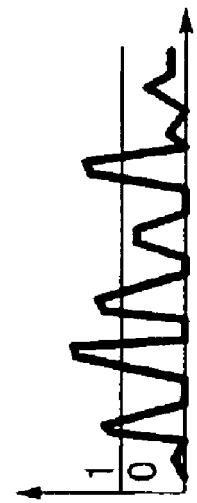
Figure 7:
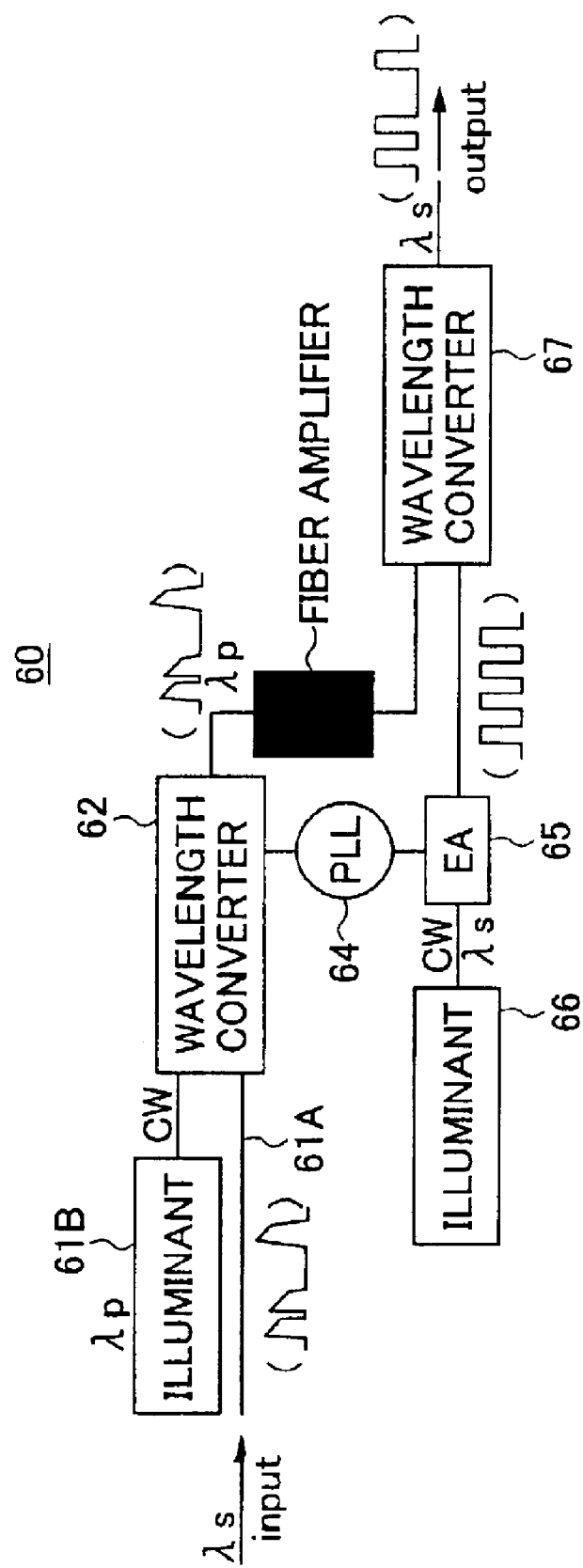
FIG. 7 is a diagram illustrating a structure of a conventional optical signal shaping circuit.
Figure 8A:
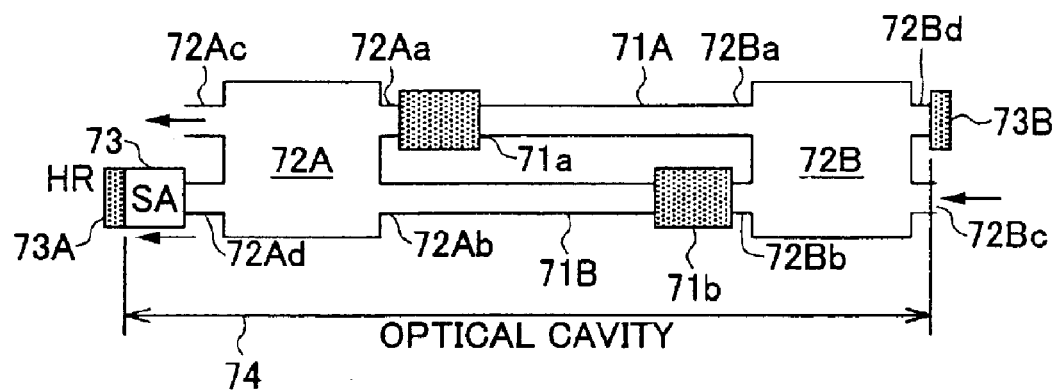
FIGS. 8A and 8B are diagrams illustrating a structure and an operation of an optical interferometer according to a first embodiment of the present invention.
Figure 8B:
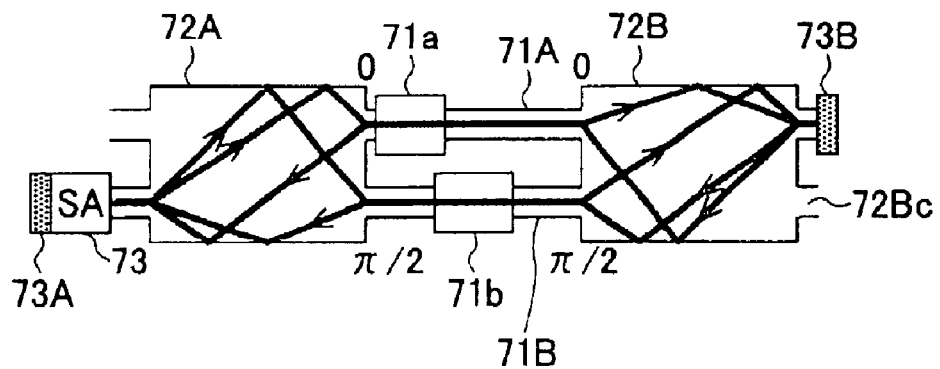

FIGS. 8A and 8B are diagrams illustrating a structure and an operation of an optical interferometer 70 according to the first embodiment of the present invention.

In FIG. 8A, the optical interferometer 70 comprises two optical waveguides 71A and 71B, a pair of multi-mode optical interferometers (MMI) 72A and 72B, and nonlinear gain media 71a and 71b, wherein the pair of multi-mode optical interferometers 72A and 72B are connected by the optical waveguides 71A and 71B, that is, the optical interferometer 70 has the Mach-Zehnder type structure, and wherein the nonlinear gain media 71a and 71b are asymmetrically placed in the optical waveguides 71A and 71B with respect to the axis direction.

Both of the multi-mode optical interferometers 72A and 72B have two inputs and two outputs. Namely, the multi-mode optical interferometer 72A has an optical input-output port 72Aa connected with the optical waveguide 71A and an optical input-output port 72Ab connected with the optical waveguide 71B, and on the other hand, the multi-mode optical interferometer 72B has an optical input-output port 72Ba connected with the optical waveguide 71A and an optical input-output port 72Bb connected with the optical waveguide 71B.

Also, the multi-mode optical interferometers 72A has an optical input-output port 72Ac serving as an optical output port of the optical interferometer 70 and an optical input-output port 72Ad in which a high reflective mirror 73A is provided via a saturable absorption medium 73, and on the other hand, the multi-mode optical interferometer 72B has an optical input-output port 72Bc serving as an optical input port of the optical interferometer 70 and an optical input-output port 72Bd in which a high reflective mirror 73B is provided. As a result, an optical cavity 74 is formed between the high reflective mirrors 73A and 73B in the optical interferometer 70 in FIG. 8A.

As mentioned above, since the optical cavity 74 is formed due to the high reflective mirrors 73A and 73B in the optical interferometer 70 in FIG. 8A and the nonlinear gain media 71a and 71b are included in the optical cavity 74, a laser oscillation is generated due to a light traveling between the high reflective mirrors 73A and 73B. At this time, since the saturable absorption medium 73 is placed adjacently to the mirror 73A, the laser oscillation in the optical interferometer 70 is mode-locked in accordance with timing of an external optical pulse signal if the external optical pulse signal is injected from the optical input port 72Bc.

When such a mode-locked laser oscillation is generated in the optical interferometer 70, the nonlinear gain media 71a and 71b in the optical waveguides 71A and 71B function as phase modulators. As a result, it is possible to asymmetrically demultiplex and reshape the external optical pulse signal. Thus, the optical interferometer 70 can asymmetrically demultiplex the external optical pulse signal and reshape the signal waveform of the external optical pulse signal simultaneously.

In the following, a description will now be given, with reference to FIG. 8B, of the mode-locked laser oscillation arising in the optical cavity 74 in FIG. 8A. FIG. 8B shows paths of the mode-locked light traveling between the high reflective mirrors 73A and 73B.

In FIG. 8B, after the mode-locked light is reflected to the high reflective mirror 73A, the mode-locked light is injected to the saturable absorption medium 73. Furthermore, the mode-locked light passes through the optical input-output port 72Ad. Then, the mode-locked light is injected to the multi-mode optical interferometer 72A and is split to two lights. One of the lights enters the optical waveguide 71A from the optical input-output port 72Aa. After the light is amplified and phase-modulated in the nonlinear gain medium 71a, the resulting light enters the multi-mode optical interferometer 72B. The other light enters the optical waveguide 71B from the optical input-output port 72Ab. After the other light is amplified and phase-modulated in the nonlinear gain medium 71b, the resulting light enters the multi-mode optical interferometer 72B.

In the multi-mode optical interferometer 72B, the above two lights are directed together to the high reflective mirror 73B provided in the optical input-output port 72Bd. After the lights are reflected to the high reflective mirror 73B, the lights are split again into two lights in the multi-mode optical interferometer 72B and the two lights are injected to the optical waveguides 71A and 71B via the optical input-output ports 72Ba and 72Bb. After the two lights are amplified and phase-modulated in the nonlinear gain media 71a and 71b, the resulting lights return to the multi-mode optical interferometer 72A and arrive at the optical input-output port 72Ad. Furthermore, the light arriving at the optical input-output port 72A passes through the saturable absorption medium 73 and then is reflected to the high reflective mirror 73A.

As mentioned above, the mode-locked light generated in the optical cavity 74 in the optical interferometer 70 is injected to the saturable absorption medium 73 in both directions of the light travel between the high reflective mirrors 73A and 73B and passes through the two nonlinear gain media 71a and 71b. It is possible to realize such light paths by symmetrically aligning the multi-mode optical interferometers 72A and 72B with respect to the horizontal axis.

Figure 9A:
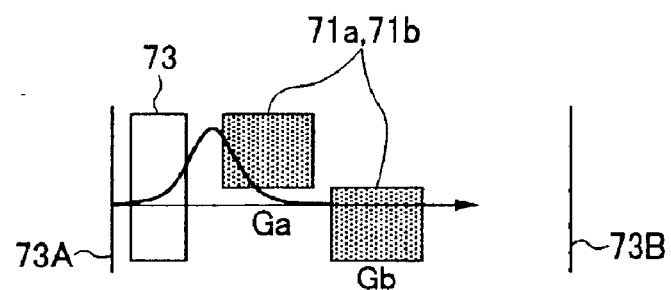
FIGS. 9A, 9B and 9C show a mode-locked operation according to the first embodiment.
Figure 9B:
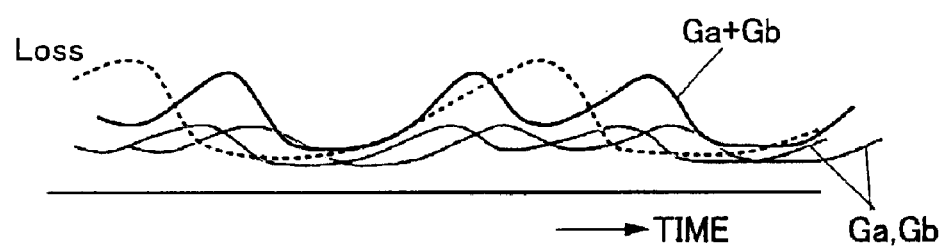
Figure 9C:
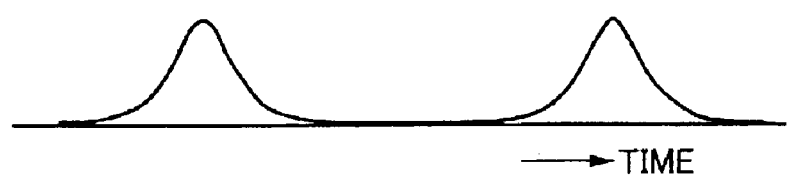

FIGS. 9A through 9C show a mode-locked operation in the optical interferometer according to the first embodiment.

It is noted that an optical cavity in FIG. 9A is equivalent to the optical cavity 74 in FIG. 8A.

In FIG. 9A, the optical pulse travels between the high reflective mirrors 73A and 73B. When the optical pulse is reflected to the high reflective mirror 73A and is injected to the saturable absorption medium 73, the light loss in the saturable absorption medium 73 sharply falls as shown in FIG. 9B and bounces back gradually after the optical pulse passes. In FIG. 9B, the horizontal axis represents time.

The nonlinear gain media 71a and 71b produce gains Ga and Gb due to an induced emission phenomenon in accordance with the injected light. However, the nonlinear gain media 71a and 71b are placed at a different position from each other toward the saturable absorption medium 73 with respect to the axis direction of the light cavity 74. Accordingly, if the sum Ga+Gb rises at the time when the optical pulse passes through the saturable absorption medium 73 and the light loss caused by the saturable absorption medium 73 decreases as shown in FIG. 9B, the light amplification arises at this time and the optical pulse shown in FIG. 9C is iteratively formed. That is a mode-locked oscillation according to this system.

A description will now be given, with reference to FIGS. 10A and 10B, of an optical switching in the optical interferometer 70 in FIG. 8A on the ground of the above description pertaining to the mode-locked oscillation.

Figure 10A:
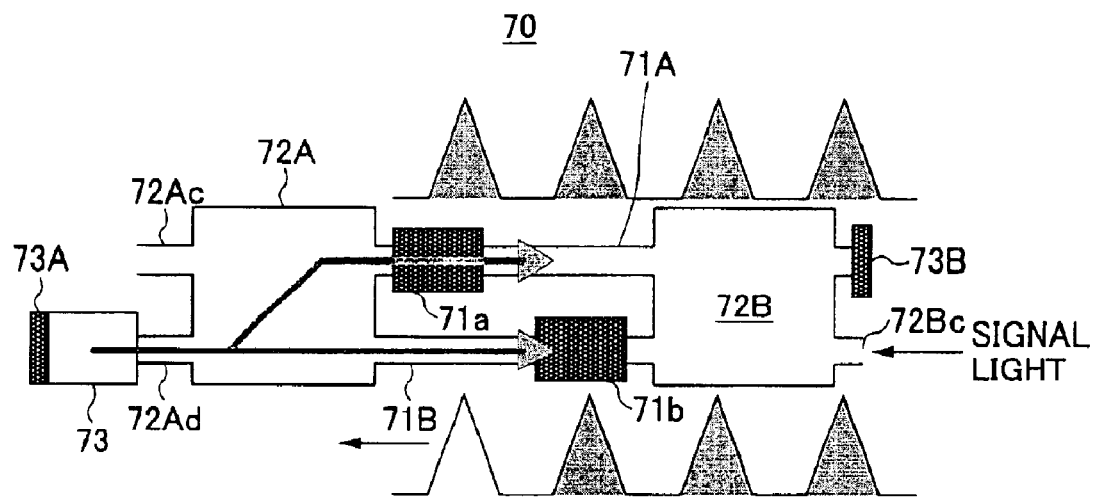
FIGS. 10A and 10B show an optical switching operation of the optical interferometer according to the first embodiment.

In FIG. 10A, it is assumed that when a mode-locked light from the multi-mode optical interferometer 72A travels to the multi-mode optical interferometer 72B via the optical waveguides 71A and 71B in the optical interferometer 70 in which such a mode-locked oscillation occurs, an external optical signal pulse sequence is injected via the optical input port 72Bc. Under this assumption, the induced emission and the accompanying exhaustion arise soon in the optical waveguide 71A due to the mode-locked light in the nonlinear gain medium 71a placed near the multi-mode optical interferometer 72A, whereas the induced emission in the nonlinear gain medium 71b arises in the optical waveguide 71B later than that in the nonlinear gain medium 71a because the nonlinear gain medium 71b is placed far from the multi-mode optical interferometer 72A.

In the optical waveguide 71B, the optical signal pulse injected from the multi-mode optical interferometer 72B to the optical waveguides 71A and 71B passes through the nonlinear gain medium 71b in which there arises no carrier exhaustion caused by the induced emission. In contrast, in the optical waveguide 71A, the optical signal pulse injected from the multi-mode optical interferometer 72B to the optical waveguides 71A and 71B passes through the nonlinear gain medium 71a in which the carrier exhaustion caused by the induced emission arises.

When the carrier exhaustion occurs in the nonlinear gain media 71a and 71b, a refractive index of the optical waveguide varies and there arises a phase difference between the optical pulses passing through the optical waveguides 71A and 71B.

Figure 10B:
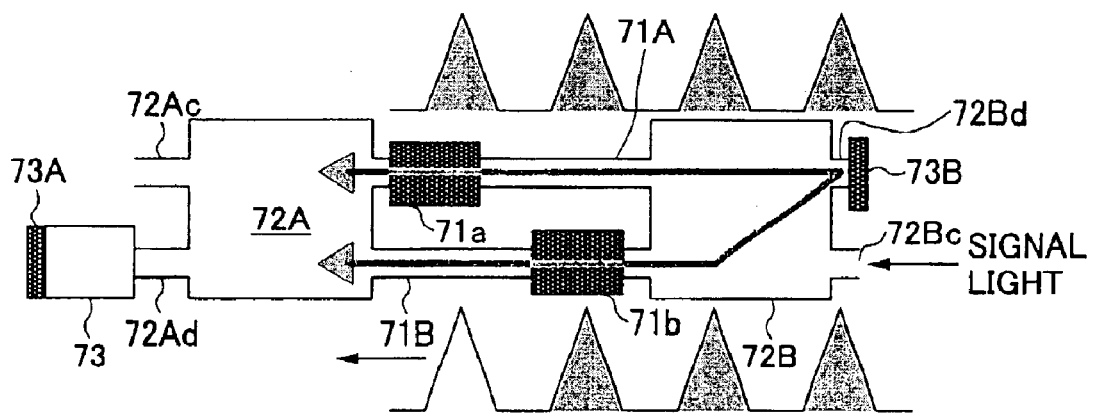

In FIGS. 10A and 10B, the multi-mode optical interferometer 72A is designed such that an output light is generated in the optical input-output port 72Ac if the optical pulses injected via the optical waveguides 72A and 72B have the in-phase, whereas an output light is generated in the optical input-output port 72Ad if the optical pulses injected via the optical waveguides 72A and 72B have the reverse-phase. Thus, in FIG. 10A, although the output light is generated in the optical input-output port 72Ad, the saturable absorption medium 73 is provided in the optical input-output port 72Ad. In this case, no output light is generated in the optical input-output port 72Ac.

In FIG. 10B, when a mode-locked light reflected by the high reflective mirror 73B travels to the multi-mode optical interferometer 72A via the optical waveguides 71A and 71B, an optical signal pulse injected from the optical input-output port 72Bc travels in the same direction and at the same speed as the mode-locked light. Accordingly, even if absorption saturation occurs in the nonlinear gain media 71a and 71b due to the mode-locked light, the phase difference does not arise between the output optical pulses transmitted in the optical waveguides 71A and 71B at the time when the optical signal pulse arrives at the multi-mode optical interferometer 72A. As a result, an output optical pulse is generated corresponding to the injected optical signal pulse in the optical input-output port 72Ac of the multi-mode optical interferometer 72A.

As mentioned above, the optical interferometer 70 in FIG. 8A can work as an all-optical switch for switching the injected optical signal pulse.

Additionally, in FIG. 10A, the output light is generated in accordance with the optical signal pulse in the optical input-output port 72Ad and is injected to the saturable absorption medium 73. However, especially when the wavelength of the injected optical signal pulse is equal to that of the mode-locked light, the injected optical signal pulse is involved in the mode-locked oscillation. As a result, the mode-locked oscillation is automatically achieved at the optical switching.

Figure 11:
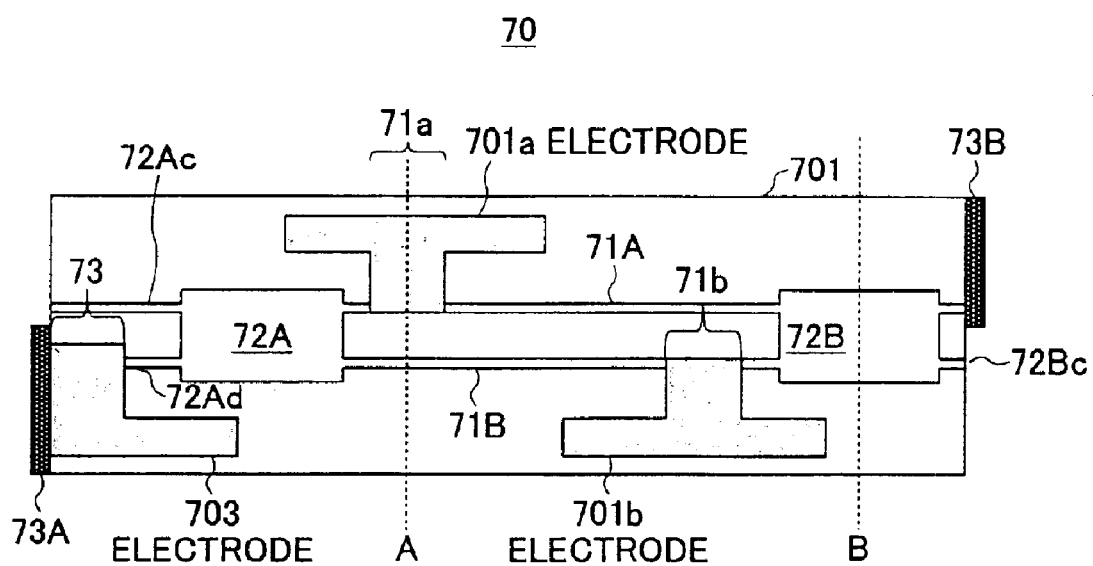
FIG. 11 is a diagram illustrating a detailed structure of the optical interferometer according to the first embodiment.
Figure 12:
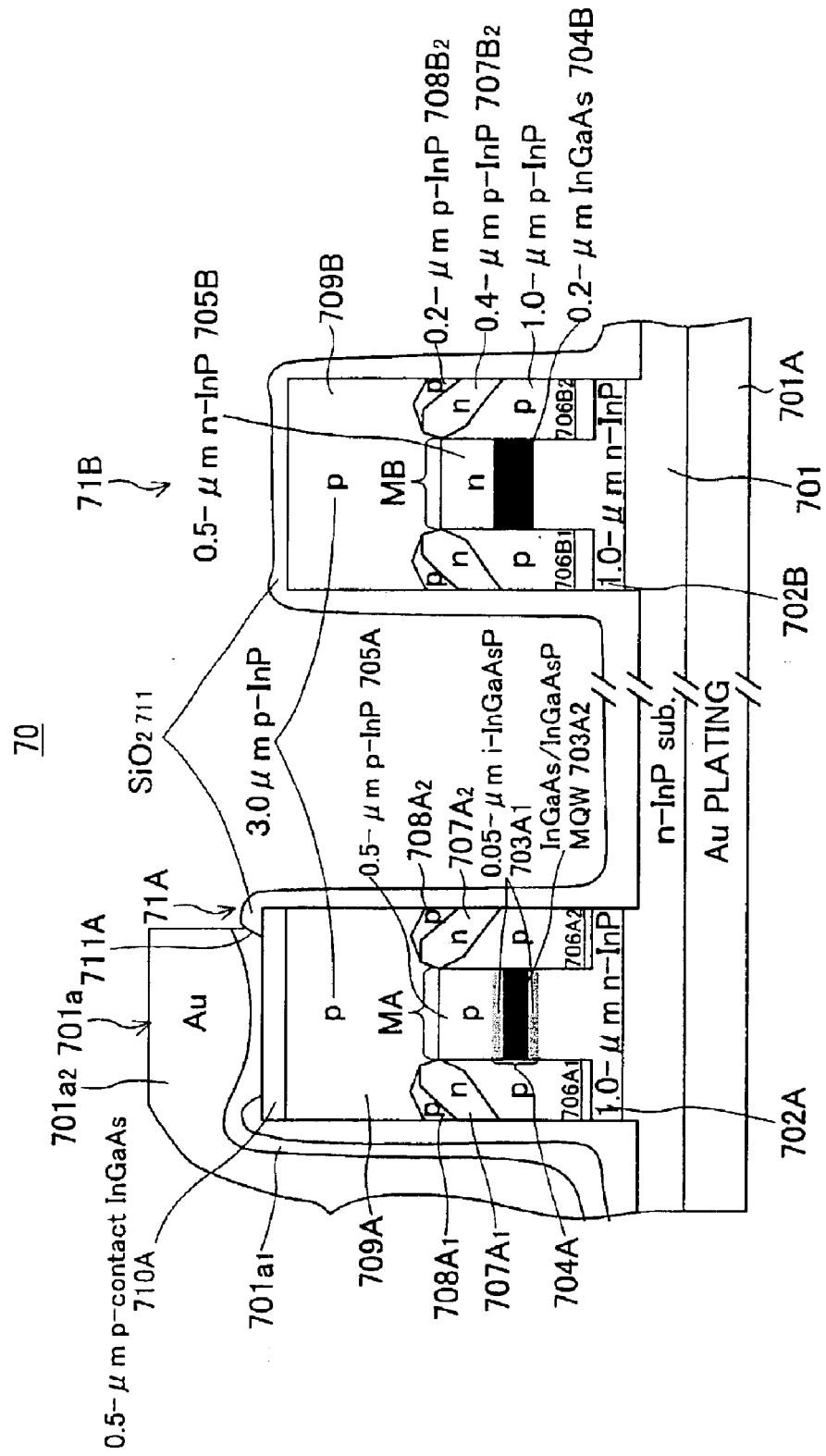
FIG. 12 is a sectional view of the optical interferometer in FIG. 11.
Figure 13:
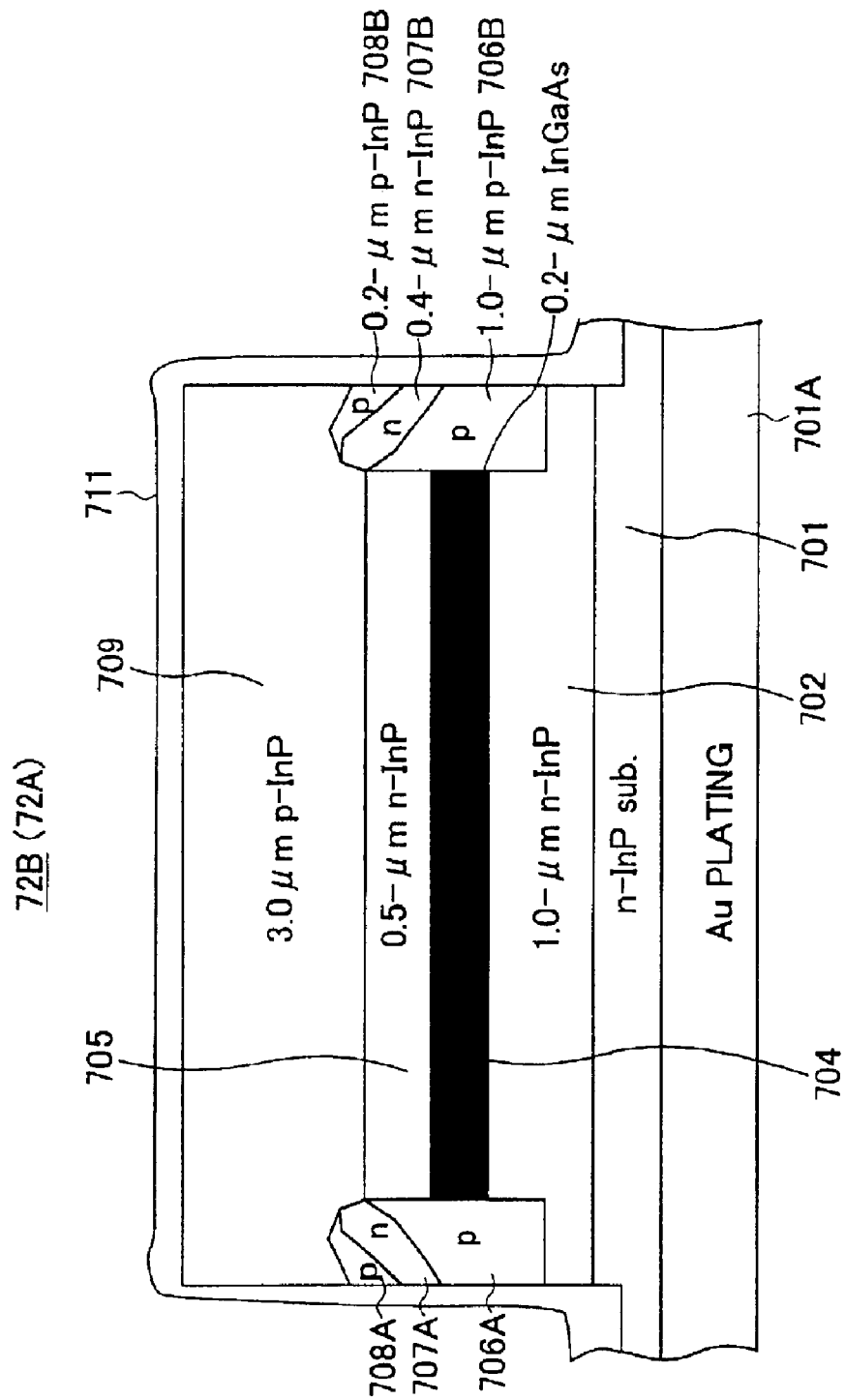
FIG. 13 is another sectional view of the optical interferometer in FIG. 11.

FIGS. 11 through 13 show the detailed structure of the optical interferometer 70 in FIG. 10A. FIG. 11 is a plan view of the optical interferometer 70 in FIG. 10A. FIGS. 12 and 13 are sectional views with respect to sections A and B shown in FIG. 11, respectively. In FIGS. 11 through 13, those parts corresponding to the parts previously described are referred to as the same reference numerals and the description thereof will be omitted.

In FIG. 11, the nonlinear gain medium 71a is formed by mounting an electrode 701a on the optical waveguide 71A, and similarly, the nonlinear waveguide 71b is formed by mounting an electrode 701b on the optical waveguide 71B. Furthermore, the saturable absorption medium 73 is formed by mounting an electrode 703 on the optical waveguide extending from the optical input-output port 72Ad to the high reflective mirror 73A.

In FIG. 12, the optical interferometer 70 is formed on an n-InP substrate 701 whose under surface is uniformly formed of an Au electrode 701A. Lower clad layers 702A and 702B having the thickness of 1.0 $\mu$m, which are formed of the n-InPs, are mounted on the n-InP substrate 701 for the optical waveguides 71A and 71B, respectively.

An optical core layer 704A is provided on the n-InP lower clad layer 702A in the optical waveguide 71A. The optical core layer 704A is formed by sandwiching an MQW structure $703A_2$, which is formed by alternately layering an InGaAs quantum well layer and an InGaAsP barrier layer iteratively, between a pair of undope InGaAsP optical waveguides $703A_1$ with respect to the vertical direction. A first p-InP upper clad layer 705A having the thickness of 0.5 $\mu$m is mounted on the optical core layer 704A. A mesa structure MA is formed of the n-InP clad layer 702A, the optical waveguide 703A, the core layer 704A and the first p-TnP upper clad layer 705A in the first optical waveguide 71A. Two p-InP buried layers $706A_1$ and $706A_2$ are formed in the both sides of the mesa structure MA. Furthermore, n-InP buried layers $707A_1$ and $707A_2$ are formed on the p-InP buried layers 706A$_1$ and 706A$_2$, respectively, and p-InP buried layers 708A$_1$ and 708A$_2$ are formed on the p-InP buried layers 707A$_1$ and 707A$_2$, respectively.

A second p-InP upper clad layer 709A having the thickness of 3.0 μm is mounted on the mesa structure MA, and a p-InP InGaAs contact layer 710A having the thickness of 0.5 μm is mounted on the second p-InP upper clad layer 709A. The optical waveguide 71A, which has the mesa structure, is formed by including the above-mentioned mesa structure MA, the contact layer 710A, the second upper clad layer 709A, the buried layers 706A$_1$ through 708A$_1$ and 706A$_2$ through 708A$_2$.

Here, in the optical waveguide 71A, those portions of the optical core layer 704A other than the portions corresponding to the electrode 701a are formed of a single InGaAs layer like the optical core layer 704B in FIG. 12. Similarly, in the optical waveguide 71B, those portions of the optical core layer 704B covered with the electrode 701b have the structure including the MQW layer like the optical core layer 704A in FIG. 12. Additionally, those portions of the first upper clad layer 705A, which constitutes the optical waveguide 71A, other than the area just beneath the electrode 701a are formed of the n-InP. Similarly, those portions of the first clad layer 705B, which constitutes the optical waveguide 71B, of the area just beneath the electrode 701b are formed of a p-InP serving as a current path. The InGaAs optical core layers 704A and 704B have the refractive indexes of about 3.25, whereas the TnP clad layers 702A, 705A and 709A, or the InP clad layers 702B, 705B and 709B have the refractive indexes of about 3.18.

In FIG. 12, the optical waveguide 71A is covered with an SiO$_2$ passivation film 711 forming an aperture 711A in which the contact layer 710A is exposed. In the aperture 711A, an AuZn ohmic electrode 701a$_1$ is formed on the contact layer 710A by an ohmic contact. Furthermore, an Au electrode 701a$_2$ is formed on the ohmic electrode 701a$_1$ by an electro plating method. The ohmic electrode 701a$_1$ and an Au electrode 701a$_2$ constitute the electrode 701a in FIG. 11 as a whole.

Similarly, in the optical waveguide 71B, an undope InGaAs optical core layer 704B having the thickness of 0.2 μm is formed on the n-InP clad layer 702B, and a first n-InP clad layer 705B having 0.5 μm is formed on the undope TnGaAs optical core layer 704B. A mesa structure MB is formed of the n-InP clad layer 702B, the optical core layer 704B, and the first p-InP upper clad layer 705B in the first optical waveguide 71B. Two p-InP buried layers 706B$_1$ and 706B$_2$ are formed in the both sides of the mesa structure MB. Furthermore, n-InP buried layers 707B$_1$ and 707B$_2$ are formed on the p-InP buried layers 706B$_1$ and 706B$_2$, respectively, and p-InP buried layers 708B$_1$ and 708B$_2$ are formed on the p-InP buried layers 707B$_1$ and 707B$_2$, respectively.

A second p-InP upper clad layer 709B is mounted on the mesa structure MA. The optical waveguide 71B, which has the mesa structure, is formed by including the above-mentioned mesa structure MB, the second upper clad 709B, the buried layers 706B$_1$ through 708B$_1$ and 706B$_2$ through 708B$_2$. The mesa structure MB, which constitutes the optical waveguide 71B, is covered with an SiO$_2$ passivation film 711.

It is noted that the similar sectional structure is formed in the nonlinear gain medium 71b comprising a semiconductor optical amplifier and in the saturable absorption medium 73. In the nonlinear gain medium 71b, the electrode 701b is provided in the optical waveguide 71B. The saturable absorption medium 73 also has the same sectional structure.

FIG. 13 is a sectional view of the multi-mode optical interferometer 72B in the optical interferometer 70 in FIG. 11 with respect to the section B.

In FIG. 13, an n-InP lower clad layer 702 having the thickness of 1.0 μm is mounted on the n-InP substrate 701 as an extending part of the lower clad layers 702A and 702B, and an undope InGaAs optical core layer 704 having the thickness of 2.0 μm is mounted on the lower clad layer 702 as an extending part of the optical core layers 704A and 704B. Furthermore, a first n-InP upper clad layer 705 having the thickness of 0.5 μm is mounted on the optical core layer 704 as an extending part of the first upper clad layers 705A and 705B. A second p-InP upper clad layer 709 is mounted on the first upper clad layer 705 as an extending part of the second upper clad layers 709A and 709B. A p-buried layer 706A corresponding to an extending part of the p-InP buried layer 706A$_1$, a n-buried layer 707A corresponding to an extending part of the n-InP buried layer 707A$_1$, and a p-buried 708A corresponding to an extending part of the p-InP buried 708A$_1$ are layered in one side of the mesa structure formed of the lower clad layer 702, the optical core 704 and the first upper clad layer 705. A p-buried layer 706B corresponding to an extending part of the p-InP buried layer 706B$_1$, a n-buried layer 707B corresponding to an extending part of the n-InP buried layer 707B$_1$, and a p-buried 708B corresponding to an extending part of the p-InP buried 708B$_1$ are layered in the other side of the mesa structure formed of the lower clad layer 702, the optical core 704 and the first upper clad layer 705.

In the optical interferometer 70 in FIG. 11, when a forward-biased voltage is applied to the electrodes 701a and 701b, the nonlinear gain media 71a and 71b are formed, respectively. Also, when a reverse-biased voltage is applied to the electrode 703, the saturable absorption medium 73 is formed.

In the saturable absorption medium 73 in FIG. 11, the optical core layer is formed of the InGaAsP. At this time, the saturable absorption medium 73 may be formed, for example, so that the width of the saturable absorption medium 73 can be 1 μm and the length of the saturable absorption medium 73 in the optical waveguide direction can be 75 μm. Also, the multi-mode optical interferometers 72A and 72B may be formed, for example, so that the widths of the multi-mode optical interferometers 72A and 72B can be 15 μm and the length of the multi-mode optical interferometers 72A in the light injection direction can be 330 μm. The semiconductor optical amplifier constituting the nonlinear gain media 71a and 71b are formed such that the semiconductor optical amplifier has the length of 330 μm in the optical waveguide having the width of 1 μm. It is noted that the length of the semiconductor optical amplifier varies in accordance with the amount of the injected current. For example, the length of the semiconductor optical amplifier may be 300 μm.

Figure 14:
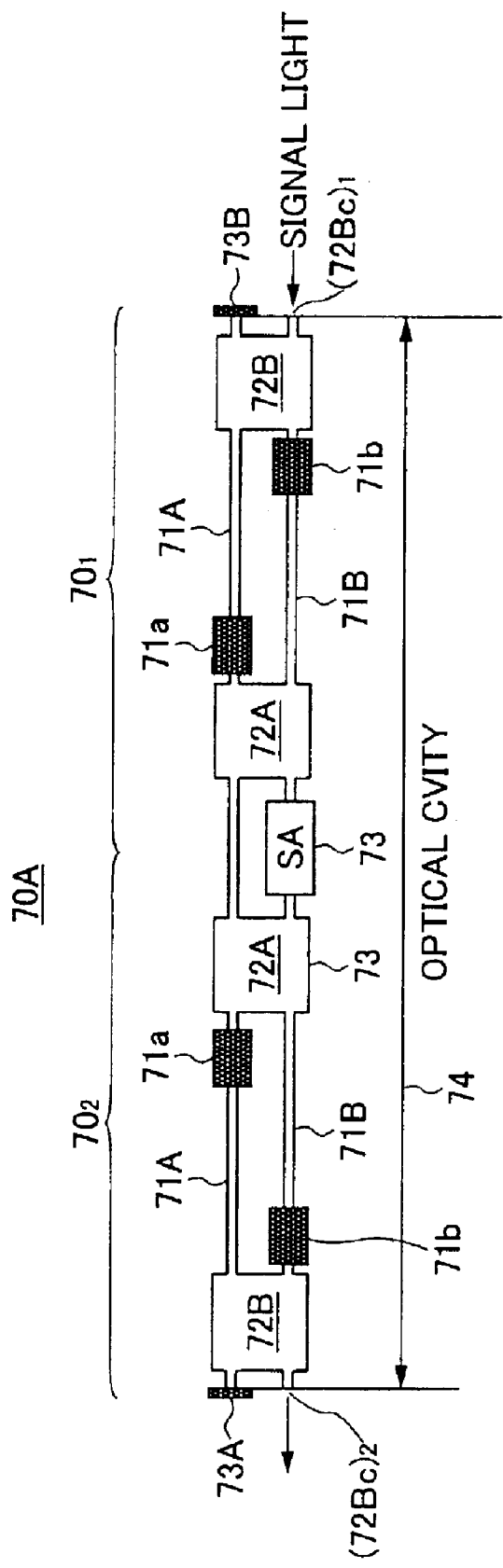
FIG. 14 is a diagram illustrating a variation of the optical interferometer according to the first embodiment.

FIG. 14 shows a structure of an optical interferometer 70A as a variation equivalent to the optical interferometer 70 in FIG. 8A.

In FIG. 14, the optical interferometer 70A has optical interferometers 70$_1$ and 70$_2$ whose structures are the same as the optical interferometer 70, wherein the optical interferometers 70$_1$ and 70$_2$ are symmetrically placed with respect to the saturable absorption medium 73, and switches the transmission of an optical signal pulse injected from an optical input-output port (72Bc)$_1$ corresponding to the optical input-output port 72Bc to an optical input-output port (72Bc)$_2$ corresponding to the optical input-output port 72Bc.

Figure 15:
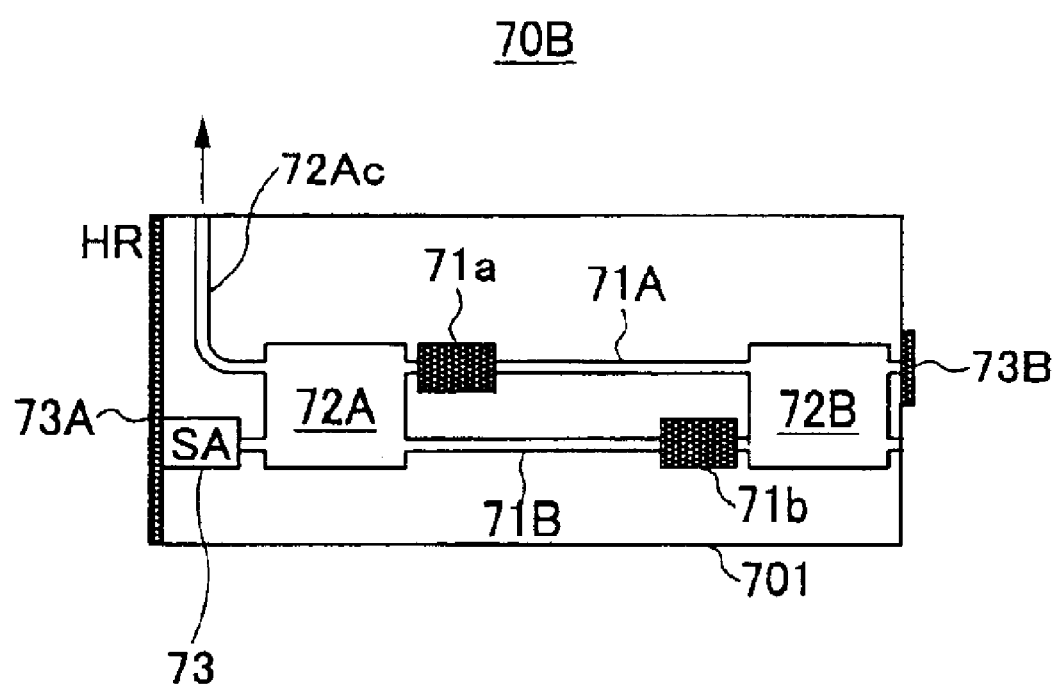
FIG. 15 is a diagram illustrating another variation of the optical interferometer according to the first embodiment.

FIG. 15 shows an optical interferometer 70B as another variation of the optical interferometer 70 in FIG. 8A.

In FIG. 15, the optical interferometer 70B is provided on the InP substrate 701 described in FIGS. 11 through 13, and the high reflective mirror 73A is extended on an entire end surface in the ejection side of the InP substrate 701.

In the optical interferometer 70B, since the high reflective mirror 73A is mounted on the entire end surface of the ejection side of the InP substrate 701, an optical input-output port 72Ac to which an output optical signal pulse is ejected is directed to one side surface of the substrate 701 by the optical waveguide.

A description of other features and operations of the optical interferometer 70B in FIG. 15 is similar to the previous descriptions and the description thereof will be omitted.

Figures 16A, 16B, 16C:
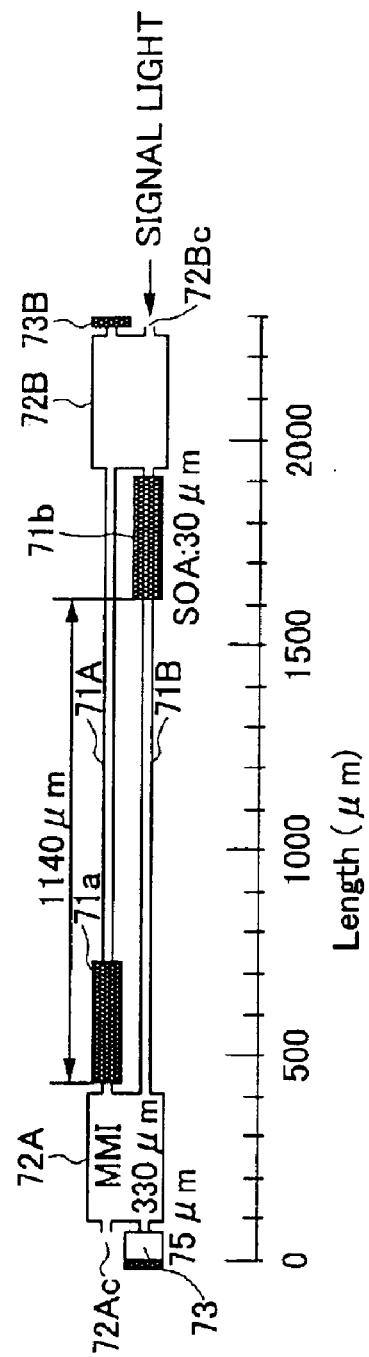
FIGS. 16A, 16B and 16C are diagrams illustrating a structure and an operation of an optical interferometer according to a second embodiment of the present invention.

FIGS. 16A through 16C show a structure and an operation of an all-optical asymmetric demultiplexer 80, which incorporates the optical interferometer 70 therein, according to the second embodiment of the present invention, wherein those parts previously described are referred to as the same numerals and the description thereof will be omitted.

In FIG. 16C, the all-optical asymmetric demultiplexer 80 is constructed based upon the optical interferometer 70 in FIG. 11 and is set so that the length of the optical cavity between the high reflective mirrors 73A and 73B can be 2300 μm.

As shown in FIG. 16A, if the optical cavity length is set to be 2300 μm in the optical interferometer, a mode-locked light having the speed of 40 Gbit/s is formed as a second order higher harmonic of a fundamental mode-locked light. Also, when the interval between the nonlinear gain media 71a and 71b is set to be 1140 μm, it is possible to coincide the interval between the nonlinear gain media 71a and 71b with the pulse interval of an optical signal of 80 Gbit/s.

As is shown in FIG. 16B, when the optical signal pulse of 80 Gbit/s is supplied to the optical input-output port 72Bc, two optical signal pulses are injected while the mode-locked light is traveling forward and backward in the optical cavity. As is shown in FIG. 10A, the differential phase shift arises between the optical waveguides 71A and 71B for one optical signal injected at the timing when the optical signal is faced on the mode-locked light. As a result, the injected optical signal is directed to the optical input-output port 72Ad of the multi-mode optical interferometer 72A in which the saturable absorption medium 73 is provided.

On the other hand, as mentioned in FIG. 10B, there arises no differential phase shift between the optical waveguides 71A and 71B for the other optical signal injected at the timing when the optical signal is faced on the mode-locked light. As a result, the optical signal is directed to the optical input-output port 72Ac, and it is possible to extract the optical signal of 40 Gbit/s from the input optical signal of 80 Gbit/s. At this time, the mode-locked light is involved in the timing caused by the injected optical signal pulse to the saturable absorption medium 73. Consequently, it is possible to automatically achieve the timing synchronization of the injected optical signal and the mode-locked light.

FIGS. 17A through 17C show a structure of an all-optical asymmetric demultiplexer 90 according to the third embodiment of the present invention, wherein those parts previously described are referred to as the same numerals and the description thereof will be omitted.

In FIGS. 17A through 17C, like the all-optical asymmetric demultiplexer 80 in FIG. 16, the all-optical asymmetric demultiplexer 90 is constructed based upon the optical interferometer 70 in FIG. 11 and is set so that the interval between the nonlinear gain media 71a and 71b can be 1710 μm. Also, the optical cavity length between the high reflective mirrors 73A and 73B is set to be 3400 μm.

In such an optical interferometer, if the optical cavity length is set to be 3400 μm, the mode-locked light having the speed of 40 Gbit/s is formed in the optical cavity as a third order higher harmonic of the fundamental mode-locked light as shown in FIG. 17A. Also, when the interval between the nonlinear gain media 71a and 71b is set to be 1140 μm, it is possible to coincide the interval between the nonlinear gain media 71a and 71b with the length of three optical signal pulses of 160 Gbit/s.

As is shown in FIG. 17B, if an optical signal pulse of 160 Gbit/s is supplied to the optical input-output port 72Bc, three optical signal pulses are directed to the saturable absorption medium 73 like the previous case and only one optical signal pulse is directed to the optical input-output port 72Ac. In this case, the mode-locked light is automatically involved in the timing of the optical signal pulse.

Figures 18A, 18B, 18C:
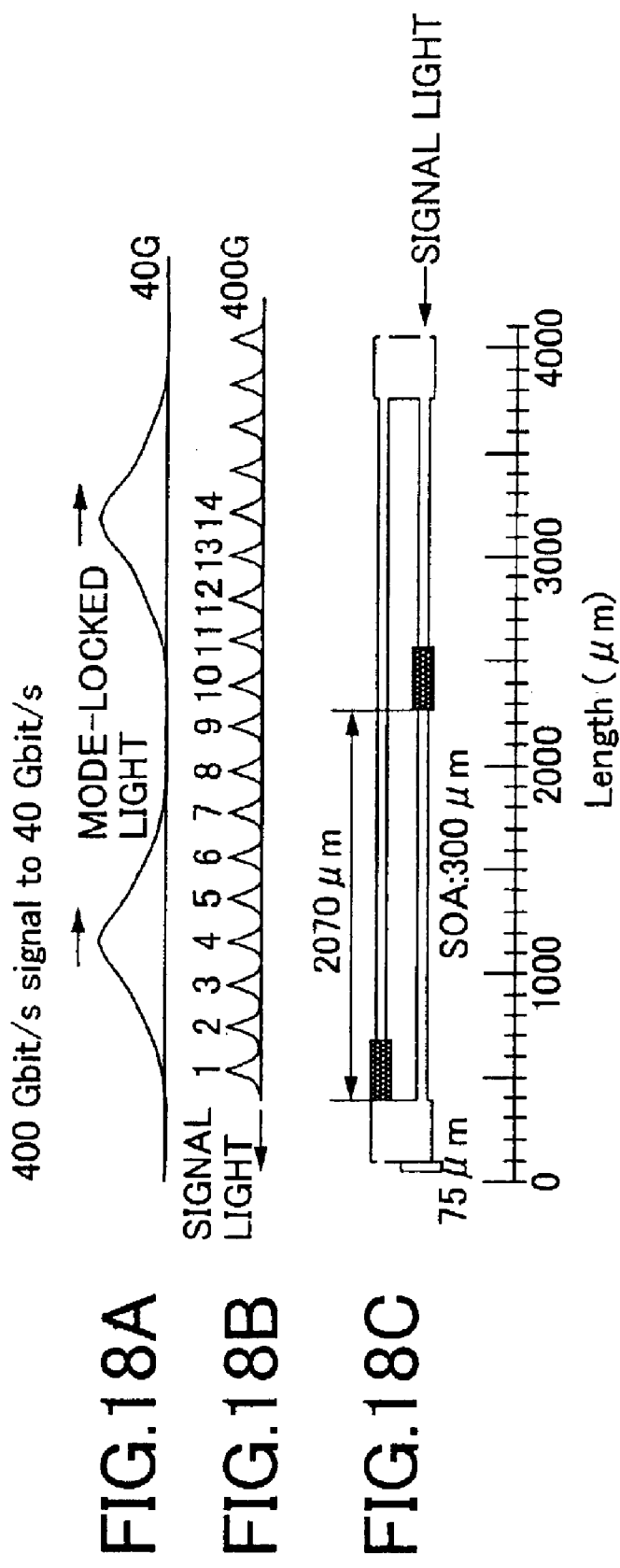
FIGS. 18A, 18B and 18C are diagrams illustrating a structure and an operation of an optical interferometer according to a fourth embodiment of the present invention.

FIGS. 18A through 18C show a structure of an all-optical asymmetric demultiplexer 100 according to the fourth embodiment of the present invention, wherein those parts previously described are referred to as the same numerals and the description thereof will be omitted.

In FIGS. 18A through 18C, like the optical asymmetric demultiplexer 80 in FIG. 16, the optical asymmetric demultiplexer 100 is constructed based upon the optical interferometer 70 in FIG. 11 and is set so that the interval between the nonlinear gain media 71a and 71b can be 2710 μm. Also, the length of the optical cavity between the high reflective mirrors 73A and 73B is set to be 4560 μm.

In such an optical interferometer, if the optical cavity length is set to be 4560 μm, the mode-locked light having the speed of 40 Gbit/s is formed in the optical cavity as a fourth order higher harmonic of the fundamental mode-locked light as shown in FIG. 18A. Also, when the interval between the nonlinear gain media 71a and 71b is set to be 2710 μm, it is possible to coincide the interval between the nonlinear gain media 71a and 71b with the length of nine optical signal pulses of 400 Gbit/s.

As is shown in FIG. 18B, if an optical signal pulse of 400 Gbit/s is supplied to the optical input-output port 72Bc, nine optical signal pulses are directed to the saturable absorption medium 73 like the previous case and only one optical signal pulse is directed to the optical input-output port 72Ac. In this case, the mode-locked light is automatically involved in the timing of the optical signal pulse.

It is noted that although the output optical signals of the optical asymmetric demultiplexers 70 through 100 according to the above-mentioned embodiments of the present invention have the speed of 40 Gbit/s, the present invention is not limited to the specific signal speed. It is possible to design an optical asymmetric demultiplexer so that an output signal of the optical asymmetric demultiplexer can have a higher or a lower speed than that speed.

Also, in the optical asymmetric demultiplexers 70 through 100 according to the above-mentioned embodiments of the present invention, it is preferable that the optical signal pulse has a wavelength different from that of the mode-locked light so that only the optical signal can be easily separated from the mode-locked light by using a filter. In particular, it is preferable that the optical signal pulse has a transparent wavelength for the semiconductor optical amplifier constituting the nonlinear gain media 71a and 71b. That is why if the optical signal pulse has the wavelength under which there arises a gain in the nonlinear gain media 71a and 71b, the injection of the optical signal pulse causes optical amplification effect, thereby fluctuating the carrier density. As a result, the optical switching is disordered. Also, there arises luminescence due to spontaneous emission in the semiconductor optical amplifier constituting the nonlinear gain media 71a and 71b, and then amplification of luminescence generates noise. Such a spontaneous emission light has the wavelength in which the semiconductor optical amplifier produces a gain. Thus, if an optical signal is set to have a different wavelength from the mode-locked light, in other words, if the optical signal is set to have the wavelength in which the nonlinear gain media 71a and 71b become transparent, it is possible to easily separate the optical signal from the mode-locked light by using a filter. Even in such a case that the transparent optical signal wavelength is used, there also arises variation of the refractive index in the nonlinear gain media 71a and 71b due to the mode-locked light. Therefore, the optical switching caused by the differential phase shift between the optical signal pulses is also effective in the optical signal wavelength.

FIGS. 19A through 19C show a structure of an all-optical pulse reshaping element (3R element) 110 according to the fifth embodiment of the present invention, wherein those parts previously described are referred to as the same numerals and the description thereof will be omitted.

The all-optical 3R element 110 according to this embodiment performs a regenerating process, a reshaping process and a retiming process for an injected optical signal pulse having the wavelength of 1.55 µm and the speed of 160 Gbit/s without any conversion into other types such as an electric signal.

In FIGS. 19A through 19C, like the all-optical asymmetric demultiplexers 80 through 100 previously described, the optical 3R element is constructed based upon the optical interferometer 70 in FIG. 11 and the interval between the nonlinear gain media 71a and 71b is set to be 280 µm in the optical 3R element. The length of the optical cavity between the high reflective mirrors is set to be 1680 µm.

As is shown in FIG. 19A, in such an optical interferometer, if the optical cavity is set to be 1680 µm, the mode-locked light of 160 Gbit/s is formed in the optical cavity as a sixth order higher harmonic of the fundamental mode-locked light. Also, when the interval between the nonlinear gain media 71a and 71b is set to be 280 µm, the interval between the nonlinear gain media 71a and 71b becomes a half of the interval of the optical signal pulse of 160 Gbit/s.

As is shown in FIG. 19B, when the optical signal pulse of 160 Gbit/s is injected to the optical input-output port 72Bc, there exists timing such that the optical signal pulse overlaps the mode-locked light traveling in the opposite direction to the optical signal pulse in both of the nonlinear gain media 71a and 71b because the optical signal pulse has the same speed as the mode-locked light. As a result, a portion of the optical signal pulse corresponding to the timing is selectively switched to the optical input-output port 72Ac. At this time, if the nonlinear gain media 71a and 71b are placed not in the peak of the phase difference of the optical signal pulse but a boundary of the next optical signal pulse, it is possible to discard an extending portion of the optical signal pulse or an overlapped portion of the two optical signal pulses, that is, it is possible to perform the reshaping process and the retiming process for the optical pulse.

A description will now be given of a control method of the mode-locked higher harmonic that is used under the present invention and an optical asymmetric demultiplexer, which adopts the control method therein, according to the sixth embodiment of the present invention.

Regarding a normal mode-locked laser, the order of a higher harmonic of the mode-locked light increases as a more amount of current is injected to a gain medium. Thus, it is possible to obtain a desired order of higher harmonic of the mode-locked light without the use of a special structure. However, if a certain structure to be mentioned in the following is adopted, it is possible to stable an operation of the mode-locked laser.

Figure 20A:
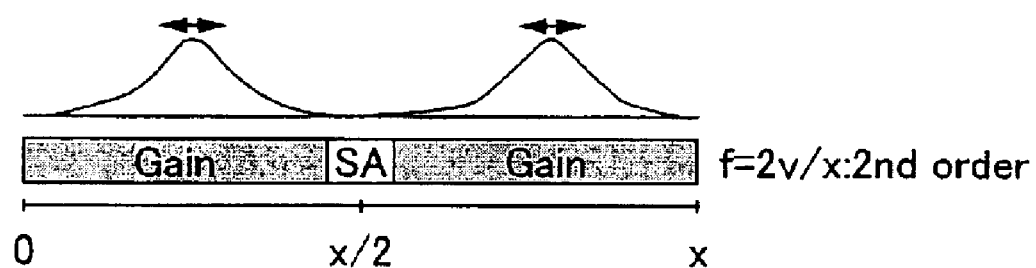
FIGS. 20A and 20B are diagrams illustrating an operation of a conventional colliding mode-locked laser.
Figure 20B:
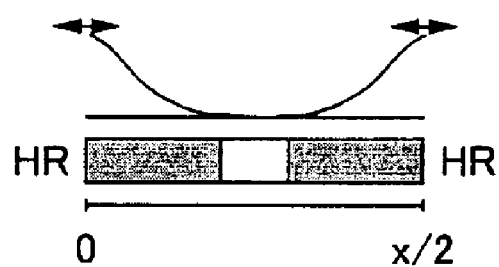

FIGS. 20A and 20B show two cases regarding the control method of the mode order of a mode-locked laser by using a colliding mode lock. One is the case in which an end surface of an optical cavity is covered with a high reflective film. The other is the case in which an end surface of an optical cavity is not covered with a high reflective film. Here, the colliding mode lock is a technique for improving generation efficiency of saturation by positioning a saturable absorption medium in such a way that mode-locked lights which are traveling facing each other are overlapped in the saturable absorption medium. In particular, when the high reflective film in FIG. 20B is used, the colliding mode lock is called a self-colliding mode lock.

In FIGS. 20A and 20B, a saturable absorption medium SA is formed at the center of the optical cavity of the length x including gain areas GAINs. If a gain is clamped in this position, it is possible to produce a mode-locked light whose frequency f is equal to nv/x, where v is the light speed in the optical cavity and n is the order of higher harmonic. FIG. 20A illustrates the second order higher harmonic of the mode-locked light.

As is shown in FIG. 20B, when a high reflective mirror HR is mounted on both end surfaces of the optical cavity, the optical cavity has the half length of that in FIG. 20A. If the saturable absorption medium SA is formed at the center of the optical cavity, it is possible to produce the higher harmonic mode-locked light similar to that in FIG. 20A.

Figure 21A:
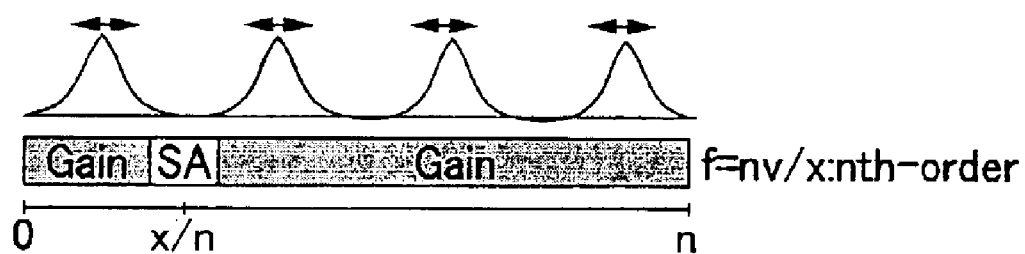
FIGS. 21A and 21B are diagrams illustrating an operation of another conventional colliding mode-locked laser.
Figure 21B:
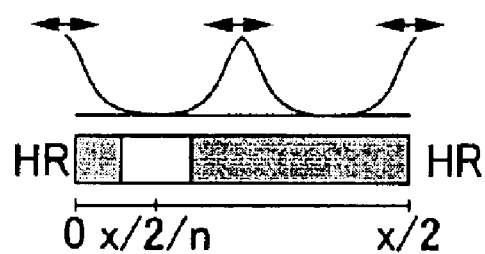

On the other hand, as is shown in FIGS. 21A and 21B, a technique for obtaining a desired mode order by providing a saturable absorption medium in the optical cavity at an asymmetrical position in accordance with the mode order is presented (T. Shimizu et al., Electronics Letters vol. 33, pp. 1869, 1997). In such a situation, FIG. 21A illustrates the case in which the high reflective films are not provided on both ends of the optical cavity, and FIG. 21B illustrates the case in which the high reflective films are provided on both ends of the optical cavity. In these configurations of the optical cavity, it is possible to increase the oscillation frequency of the mode-locked laser.

The configurations in FIGS. 21A and 21B have only the effect of increasing the oscillation frequency as long as the technique is applied to the mode-locked laser. However, if the technique is applied to the optical interferometer according to the present invention, it is possible to bring about a new effect of improving the performance of an optical functional element.

FIGS. 22A through 22C show a structure and an operation of an all-optical asymmetric demultiplexer 120, which incorporates such a saturable absorption medium in the optical cavity at an asymmetrical position, according to the sixth embodiment of the present invention, wherein those parts previously described are referred to as the same numerals and the description thereof will be omitted.

In FIGS. 22A through 22C, the all-optical asymmetric demultiplexer 120 is constructed based upon the optical interferometer 70 in FIG. 11, and the interval between the nonlinear gain media 71a and 71b is set to be 1710 µm. Also, the optical cavity length between the high reflective mirrors 73A and 73B is set to be 4560 µm.

In the optical asymmetric demultiplexer 120, furthermore, an optical waveguide 72AD is connected to the optical input-output port 72Ad of the multi-mode optical interferometer 72A, and the high reflective mirror 73A is provided on the other end of the optical waveguide 72AD. Also, in this embodiment, the saturable absorption medium 73 is provided in the optical waveguide 72AD at a distance of 1140 µm from the high reflective mirror 73A. In the configuration, an optical signal pulse of 160 Gbit/s is supplied to the optical input-output port 72Bc of the multi-mode optical interferometer 72B.

In such an optical interferometer, if the optical cavity length is set to be 4560 µm, it is possible to stably produce a mode-locked light of 40 Gbit/s in the optical cavity as shown in FIG. 22A. Also, if the interval between the nonlinear gain media 71a and 71b is set to be 1710 µm, it is possible to coincide the interval between the nonlinear gain media 71a and 71b with the length of three optical signal pulses of 160 Gbit/s.

As is shown in FIG. 22B, when an optical signal pulse of 160 Gbit/s is supplied to the optical input-output port 72Bc, three optical signal pulses are directed to the saturable absorption medium 73 like the above-mentioned case and only one optical signal pulse is directed to the optical input-output port 72Ac. In this case, the timing of the mode-locked light is automatically involved in that of the optical signal pulse.

A description will now be given of phase change required for the nonlinear gain media 71a and 71b and the timing of the phase change by using the optical asymmetric demultiplexer 90 in FIG. 17.

As mentioned in the embodiment with respect to FIG. 17, when one of four optical signal pulses traveling at the speed of 160 Gbit/s is retrieved, it is necessary to separately place the nonlinear gain media 71a and 71b by keeping the distance of three optical signal pulses between the nonlinear gain media 71a and 71b. At this time, the phase change for the optical switching operation is required to have π as an ideal phase difference between the optical waveguides 71A and 71B with respect to the three optical signal pulses and have an in-phase between the optical waveguides 71A and 71B with respect to the remaining one optical signal pulse.

Figure 23:
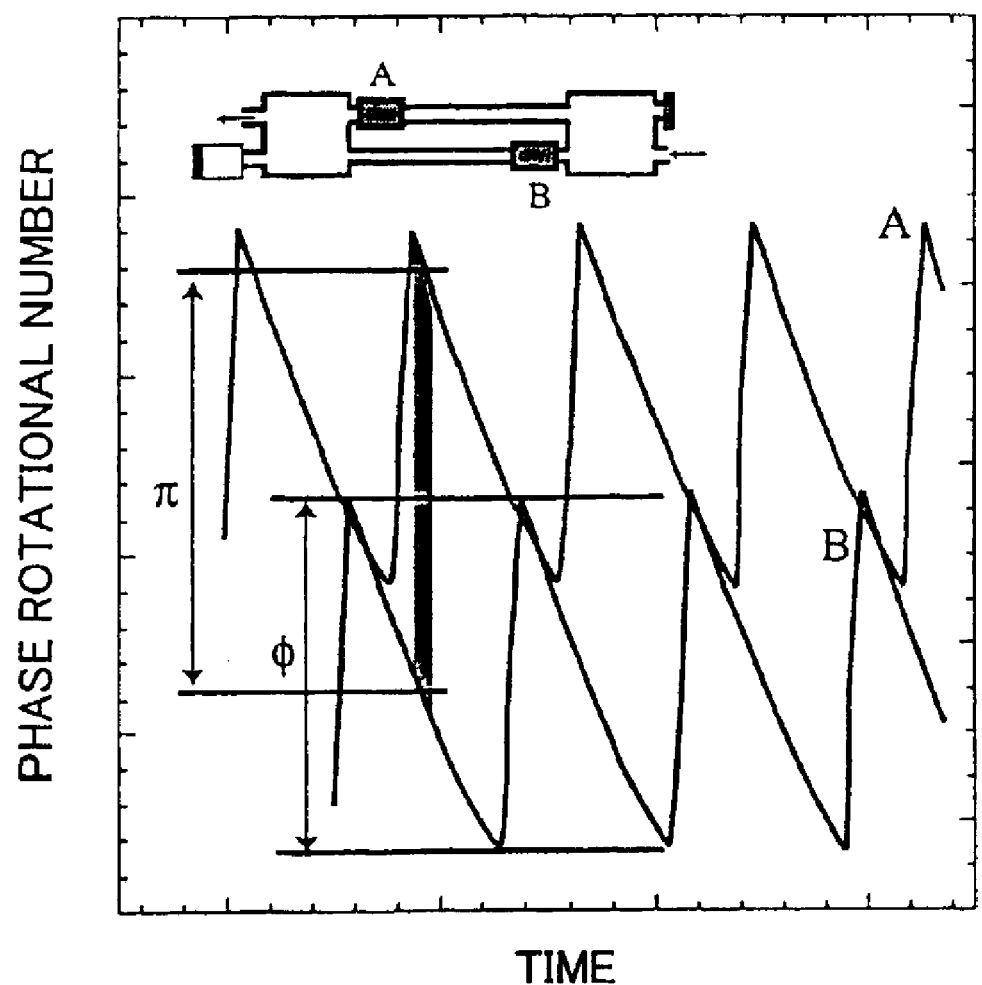
FIG. 23 is a diagram illustrating an operation of an optical interferometer according to a seventh embodiment of the present invention.

FIG. 23 shows a time variation of the differential phase shift between the optical waveguides 71A and 71B in the optical asymmetric demultiplexer 90 in FIG. 17. It is noted that the differential phase shift is ignored in FIG. 22 because of no contribution to the switching if the signal light and the mode-locked light travel in the same direction.

In FIG. 23, variations of phase changes A and B in the nonlinear gain media 71a and 71b sharply increase just after a light injection. Since the carrier density is comparatively slowly recovered, the variations of the phase changes A and B are illustrated as the form of saw with respect to time. Also, since the mode-locked lights are injected to the nonlinear waveguides 71A and 71B at a different timing each other, there is a timing gap between the phase changes A and B as shown in FIG.

Furthermore, as is shown in FIG. 23, although the phase change due to the injection of the mode-locked light in the nonlinear gain media 71a and 71b has the variation range slightly smaller than π, the phase difference between the optical waveguides 71A and 71B is set to be π with respect to the three signals and be 0 with respect to the other. Thus, it is possible to achieve the desired optical switching operation.

Figure 24:
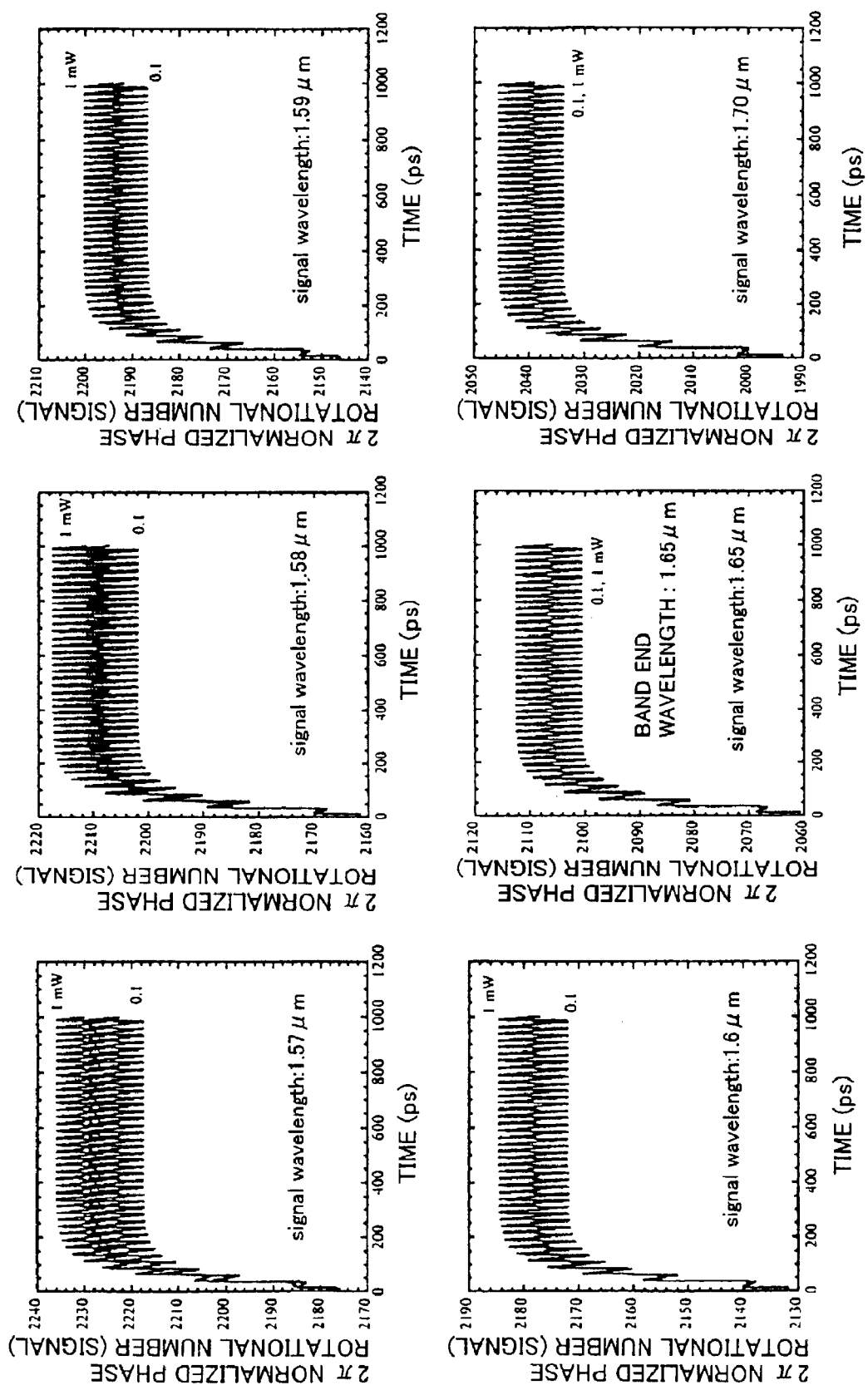
FIG. 24 is another diagram illustrating the operation of the optical interferometer according to the seventh embodiment.

FIG. 24 shows simulation results illustrating how the phase change caused by the input optical pulse varies over time. Under the simulation in FIG. 24, it is assumed that the semiconductor optical amplifier has an active layer of the width 1 µm, the length 1000 µm and the thickness 50 nm, and the wavelength of an injected light is 1.55 µm, the intensity of the injected light is 5 mW, and the wavelength of a band end of the semiconductor optical amplifier is 1.65 µm. Under this assumption, the phase change of a signal light having the wavelength approximately equal to the band end is computed with respect to the following two cases. One is the case in which the intensity of the signal light is 0.1 mW. The other is the case in which the intensity of the signal light is 1 mW.

In FIG. 24, it is observed that it takes about 200 ps for the optical interferometer to reach the stable condition after the signal light is injected. The phase change is saw-shaped as mentioned above. When the signal light has the wavelength shorter than the band end, the signal light causes the fluctuation of the carrier density in the semiconductor optical amplifier and the phase change varies in accordance with the intensity of the signal light. In contrast, when the signal light has the wavelength approximate to or longer than the band end, the phase variation does not vary in accordance with the intensity of the signal light.

Figure 25A:
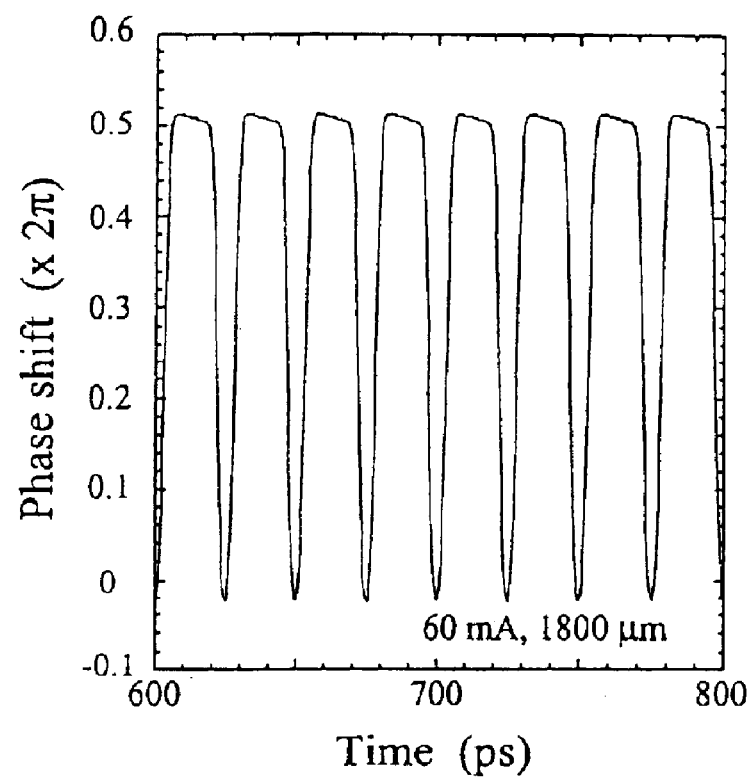
FIGS. 25A and 25B are other diagrams illustrating the operation of the optical interferometer according to the seventh embodiment.
Figure 25B:
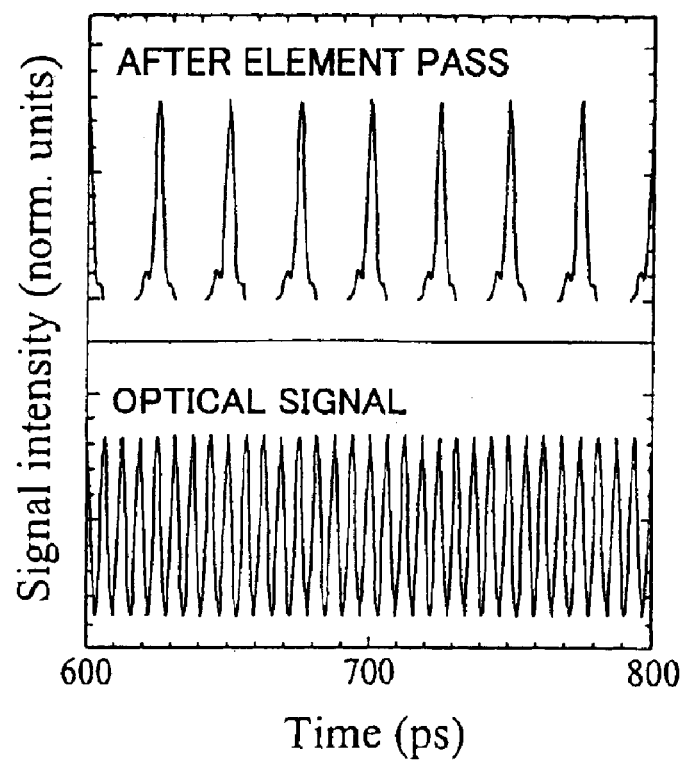

FIGS. 25A and 25B show an operation of an optical asymmetric demultiplexer according to the seventh embodiment of the present invention. In the optical asymmetric demultiplexer, the condition for the optical switching as shown in FIG. 23 is realized under an actual simulation. In FIGS. 25A and 25B, a semiconductor optical amplifier in use of the simulation is constructed similarly to that in FIG. 24 except that bias current is set to be 60 mA and the semiconductor optical amplifiers 71a and 71b have the lengths of 1800 µm.

In FIG. 25A, when the semiconductor optical amplifiers, which constitute the nonlinear gain media 71a and 71b, are separately placed by keeping each other at the distance of three optical signal pulses, the variation of the differential phase shift caused when the optical signal pulse passes through the optical waveguides 71A and 71B is illustrated with respect to time.

In FIG. 25A, it is observed that the three optical signal pulses have the phase change of about π, whereas the remaining one optical signal pulse has the differential phase shift of about 0. Consequently, when the optical signal pulse as shown in FIG. 25B is provided in this situation, it is possible to achieve the asymmetric demultiplexing operation after an element passes as shown in FIG. 25B.

The above-mentioned asymmetric demultiplexers extract an optical signal component for one channel from a time division multiplexing optical signal. On the other hand, it is possible to implement an element that can collectively extract an optical signal component for each channel from the time division multiplexing optical signal.

Figure 26:
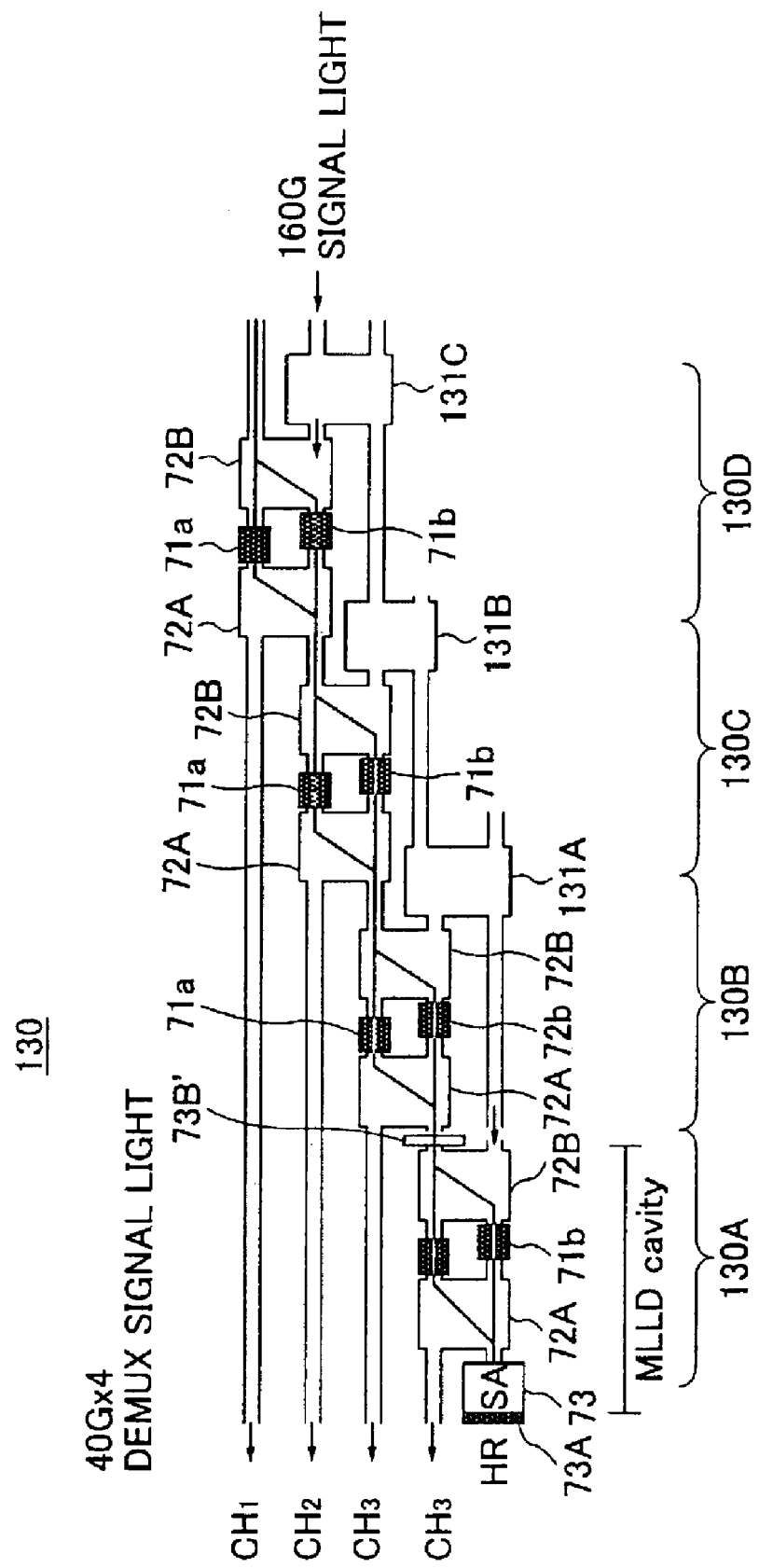
FIG. 26 is a diagram illustrating a structure of a multi-channel all-optical asymmetric demultiplexer according to an eighth embodiment of the present invention.

FIG. 26 shows a structure of an optical asymmetric demultiplexer 130 that can perform a collective asymmetric demultiplexing operation.

In FIG. 26, the optical asymmetric demultiplexer 130 is constructed by serially connecting optical interferometers 130A through 130D each of which has the similar structure to the optical interferometer 70. A time division multiplexing optical signal of 160 Gbit/s is supplied to individual optical interferometers 130A through 130D via optical distributers 131A through 131C formed of the multi-mode optical interferometers.

The optical interferometer 130A differs from the optical interferometer 70 in that the high reflective mirror 73B of the optical interferometer 70 is replaced with a translucence mirror 73B' in the optical interferometer 130A. The high reflective mirror 73A and the translucence mirror 73B' form an optical cavity of the mode-locked laser.

On the other hand, the saturable absorption medium 73 and the high reflective mirrors 73A and 73B are omitted in the individual optical interferometers 130B through 130D. As a result, the mode-locked light formed in the optical cavity of the optical interferometer 130A is supplied to the optical interferometers 130B through 130D via the translucence mirror 73B'.

When the time division multiplexing optical signal of 160 Gbit/s is supplied to the optical interferometer 130, an optical signal component of channel 1 is separated in the optical interferometer 130D, an optical signal component of channel 2 is separated in the optical interferometer 130C, an optical signal component of channel 3 is separated in the optical interferometer 130B, and finally an optical signal component of channel 4 is separated in the optical interferometer 130A.

In the configuration in FIG. 26, the saturable absorption medium 73 is provided only in the optical interferometer 130A, and the optical cavity of the mode-locked laser is provided only in the optical interferometer 130A. Under this configuration, it is easy to control the timing in the optical asymmetric demultiplexing operation, and it is possible to suppress the disorder of the optical asymmetric operation due to oscillations of a plurality of mode-locked lights. If the length of a waveguide connecting between the optical interferometers is adjusted, it is possible to design a sequence of signal separations in the optical interferometers 130A through 130D.

The present invention is not limited to the specific materials forming the above-mentioned optical interferometers. For a person having an ordinary skill in the art, it is obvious that the optical interferometers can be implemented by means of other materials. For example, the optical waveguides 71A and 71B may be formed of an optical fiber, quartziferous materials, an Si monocrystal, other various optical crystals or the like. Additionally, the optical waveguides 71A and 71B may be integrated together with the saturable absorption medium. Also, a half mirror or the like may be used to form an optical interferometer using a spatial propagating light.

Furthermore, an optical directional coupler may be used instead of the multi-mode optical interferometers 72A and 72B.

The present invention is not limited to the specifically disclosed embodiments, and variations and modifications may be made without departing from the scope of the present invention.

What is claimed is:

1. An optical interferometer, comprising:
 a first and a second optical waveguides separately extending from a first side to a second side facing the first side, the first and the second optical waveguides optically connected each other on said first side and said second side; and
 an optical cavity including said first and said second optical waveguides and extending between a first end part formed on the first side and a second end part formed on the second side,
 wherein said optical cavity has an optical output port provided on the first side by optically connecting the optical output port to said first and said second optical waveguides and an optical input port provided on the second side by optically connecting the optical input port to said first and the second optical waveguides, a first and a second nonlinear gain media optically inducing variation of a refractive index are provided in interiors of said first and said second optical waveguides, respectively, said optical cavity includes a saturable absorption medium provided on the first side by connecting the saturable absorption medium to said first and the second optical waveguides, and a mode-locked laser oscillation arises in said optical cavity.

2. The optical interferometer as claimed in claim 1, wherein said first and said second optical waveguides are optically connected on said first and said second sides by a solid optical element.

3. The optical interferometer as claimed in claim 2, wherein said solid optical element is formed of either a multi-mode optical interferometer or an optical directional coupler.

4. The optical interferometer as claimed in claim 1, wherein said optical cavity includes a first reflective surface provided on said first end part and a second reflective surface provided on said second end part.

5. The optical interferometer as claimed in claim 4, wherein said saturable absorption medium is mounted to said first end part in contact with said first reflective surface.

6. The optical interferometer as claimed in claim 4, wherein said saturable absorption medium is mounted to the said first end part away from said first reflective surface.

7. The optical interferometer as claimed in claim 1, wherein said nonlinear gain medium is a semiconductor optical amplifier.

8. The optical interferometer as claimed in claim 1, wherein said first and said second nonlinear gain media are separately provided at a first position and a second position different from the first position with respect to an optical axis direction of an interferometer connecting said first side and said second side, respectively.

9. The optical interferometer as claimed in claim 8, wherein said first and said second positions are set between a first lightwave passing through said first optical waveguide and a second lightwave passing through said second optical waveguide so that a light path difference caused by said first and said second nonlinear gain media is a multiple of a pulse width of an external optical pulse injected to said optical input port.

10. The optical interferometer as claimed in claim 1, wherein when an external optical pulse is injected to said optical input port, said mode-locked laser oscillation arises synchronously with a period of said external optical pulse.

11. The optical interferometer as claimed in claim 10, wherein said mode-locked laser oscillation arises at a higher harmonic frequency higher than or equal to a second order.

12. The optical interferometer as claimed in claim 10, wherein said first and said second nonlinear gain media are placed in said first and said second end parts so as to control a higher harmonic of said mode-locked laser oscillation, respectively.

13. The optical interferometer as claimed in claim 1, wherein an external light whose wavelength differs from a wavelength of said mode-locked laser oscillation is supplied to said optical input port.

14. The optical interferometer as claimed in claim 13, wherein said first and said second nonlinear gain media are transparent to the wavelength of said external light.

15. The optical interferometer as claimed in claim 1, wherein said first and said second optical waveguides together with said saturable absorption medium and said first and said second nonlinear gain media are integrated on a common substrate.

16. The optical interferometer as claimed in claim 15, wherein said substrate is formed of an InP substrate, said first and said second optical waveguides and said solid optical element have an InGaAs core layer buried in an InP layer, and said nonlinear optical medium has an InGaAs active layer buried in an InP layer.

17. The optical interferometer as claimed in claim 1, wherein said optical output port forms an optical waveguide ejecting an output light to an exterior of the optical interferometer between said first and said second end parts.

18. An all-optical pulse reshaping apparatus for outputting a pulse light corresponding to an external pulse light supplied to an optical input port from an optical output port, comprising:

an optical interferometer, comprising: a first and a second optical waveguides separately extending from a first side to a second side facing the first side, the first and the second optical waveguides optically connected each other on said first and said second sides; and an optical cavity including said first and said second optical waveguides and extending between a first end part formed on the first side and a second end part formed on the second side, wherein said optical cavity has said optical output port provided on the first side by optically connecting the optical output port to said first and said second optical waveguides and said optical input port provided on the second side by optically connecting the optical input port to said first and said second optical waveguides, a first and a second nonlinear gain media optically causing variation of a refractive index are provided in said first and said second optical waveguides, respectively, and said optical cavity includes a saturable absorption medium provided on the first side by connecting the saturable absorption medium to said first and said second optical waveguides, wherein a mode-locked laser oscillation arises in said optical cavity, and said mode-locked laser oscillation has a pulse frequency lower than a pulse frequency of said external pulse light.

\* \* \* \* \*

UNITED STATES PATENT AND TRADEMARK OFFICE
CERTIFICATE OF CORRECTION

PATENT NO. : 6,856,716 B2
DATED : February 15, 2005
INVENTOR(S) : Kohki Mukai

It is certified that error appears in the above-identified patent and that said Letters Patent is hereby corrected as shown below:

Title page,
Item [54], Title, change "….AND ALL OPTICAL …" to be -- ….AND ALL-OPTICAL … --

Signed and Sealed this

Thirty-first Day of May, 2005

JON W. DUDAS
*Director of the United States Patent and Trademark Office*